(12) United States Patent
Kim et al.

(10) Patent No.: US 12,242,157 B2
(45) Date of Patent: Mar. 4, 2025

(54) LIGHT SOURCE APPARATUS, METHOD FOR MANUFACTURING LIGHT SOURCE APPARATUS, AND DISPLAY APPARATUS COMPRISING LIGHT SOURCE APPARATUS

(71) Applicant: SAMSUNG ELECTRONICS CO., LTD., Suwon-si (KR)

(72) Inventors: Taeyeon Kim, Suwon-si (KR); Sungyeol Kim, Suwon-si (KR); Hyukjun Jang, Suwon-si (KR); Hyungsuk Kim, Suwon-si (KR); Chunsoon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/410,495

(22) Filed: Jan. 11, 2024

(65) Prior Publication Data

US 2024/0310675 A1    Sep. 19, 2024

Related U.S. Application Data

(63) Continuation of application No. PCT/KR2023/020082, filed on Dec. 7, 2023.

(30) Foreign Application Priority Data

Mar. 16, 2023  (KR) .................. 10-2023-0034813
Jul. 26, 2023   (KR) .................. 10-2023-0097809

(51) Int. Cl.
  *G02F 1/1335*  (2006.01)
  *G02F 1/13357* (2006.01)
  (Continued)

(52) U.S. Cl.
  CPC .. *G02F 1/133612* (2021.01); *G02F 1/133603* (2013.01); *H01L 25/167* (2013.01); *H01L 33/62* (2013.01); *H01L 2933/0066* (2013.01)

(58) Field of Classification Search
  CPC ......... G02F 1/133612; G02F 1/133603; G02F 1/133601; H01L 25/167; H01L 33/62; H01L 2933/0066
  See application file for complete search history.

(56) References Cited

U.S. PATENT DOCUMENTS 10,608,017 B2   3/2020   Takahashi et al.
10,670,918 B2   6/2020   Lee et al.

FOREIGN PATENT DOCUMENTS

CN   108375856 A   8/2018
JP   4830526 B2    12/2011
(Continued)

OTHER PUBLICATIONS

Machine translation of KR 20160107046 A (Year: 2016).*
(Continued)

*Primary Examiner* — Anne M Hines
*Assistant Examiner* — Jose M Diaz
(74) *Attorney, Agent, or Firm* — Sughrue Mion, PLLC

(57) ABSTRACT

A display apparatus includes a liquid crystal panel; and a light source apparatus including a substrate on which a plurality of light emitting diodes (LEDs) are arranged where the plurality of LEDs include a plurality of first LEDs configured to be connected in series to each other by a wiring formed on the substrate, and a plurality of second LEDs configured to be connected in series to each other by a wiring formed on the substrate, and the substrate includes a first connection portion formed between a first LED of the plurality of first LEDs and a second LED of the plurality of second LEDs.

20 Claims, 26 Drawing Sheets

(51) Int. Cl.
*H01L 25/16* (2023.01)
*H01L 33/62* (2010.01)

(56) References Cited

FOREIGN PATENT DOCUMENTS

| | | |
|---|---|---|
| KR | 10-2008-0080877 A | 9/2008 |
| KR | 10-2009-0110484 A | 10/2009 |
| KR | 10-2016-0084937 A | 7/2016 |
| KR | 10-2016-0107046 A | 9/2016 |
| KR | 10-2018-0062224 A | 6/2018 |
| KR | 10-2021-0086242 A | 7/2021 |
| KR | 10-2022-0078522 A | 6/2022 |
| WO | 2023/191268 A1 | 10/2023 |

OTHER PUBLICATIONS

Machine translation of KR 20210086242 A (Year: 2021).*
International Search Report dated Mar. 28, 2024, issued by the International Searching Authority in International Application No. PCT/KR2023/020082.
Written Opinion dated Mar. 28, 2024, issued by the International Searching Authority in International Application No. PCT/KR2023/020082.

\* cited by examiner

LIGHT SOURCE APPARATUS, METHOD FOR MANUFACTURING LIGHT SOURCE APPARATUS, AND DISPLAY APPARATUS COMPRISING LIGHT SOURCE APPARATUS

CROSS-REFERENCE TO RELATED APPLICATION

This application is a bypass continuation application of International Application No. PCT/KR2023/020082, filed on Dec. 7, 2023, which is based on and claims the benefit of a Korean Patent Application No. 10-2023-0034813, filed on Mar. 16, 2023 and a Korean Patent Application No. 10-2023-0097809, filed on Jul. 26, 2023, in the Korean Intellectual Property Office, the disclosure of each of which is incorporated by reference herein in its entirety.

BACKGROUND

Field

The disclosure relates to a light source apparatus, a method for manufacturing the light source apparatus and a display apparatus including the light source apparatus.

Description of Related Art

In general, display apparatuses are a type of output devices for visually displaying obtained or stored image information to a user, and are used in various fields such as home or workplace.

The display apparatuses include, for example, a monitor device connected to a personal computer or a server computer, a portable computer device, a navigation terminal device, a general television device, Internet Protocol Television (IPTV), portable terminal devices such as a smartphone, tablet Personal Computer (PC), a Personal Digital Assistant (PDA) or a cellular phone, various display apparatuses used to reproduce images such as advertisements or movies in an industrial field, or various kinds of audio/video systems.

The display apparatus (self-luminous display or non-self-luminous display) includes a light source apparatus for converting electric information into visual information, and the light source apparatus includes a plurality of light sources for independently emitting light. For example, each of the plurality of light sources includes a Light Emitting Diode (LED) or an Organic LED (OLED).

In particular, a local dimming technology is applied to a light source apparatus (backlight unit) of a non-self-luminous display to improve the contrast ratio of an image. The plurality of light sources are divided into a plurality of dimming blocks, and a driving device may control a driving current supplied to the light sources included in one or more dimming blocks.

The driving devices and the light sources (e.g., light emitting diodes) may be fixed to a substrate using Surface Mount Technology (SMT).

Even though the number of light emitting diodes fixed on the substrate is the same, the number of light emitting diodes included in the dimming block varies depending on the resolution of a display apparatus, and a wiring arrangement and the number of driving devices may also vary. Accordingly, various types of substrates are required depending on a resolution.

SUMMARY

According to an embodiment of the disclosure, a display apparatus may include a liquid crystal panel; and a light source apparatus including a substrate on which a plurality of light emitting diodes (LEDs) are arranged, wherein the plurality of LEDs include: a plurality of first LEDs configured to be connected in series to each other by a wiring (e.g., conductive pattern) formed on the substrate; and a plurality of second LEDs configured to be connected in series to each other by a wiring formed on the substrate where the substrate may include a first connection portion formed between a first LED of the plurality of first LEDs and a second LED of the plurality of second LEDs, based on the first connection portion electrically connecting the first LED of the plurality of first LEDs and the second LED of the plurality of second LEDs, the plurality of first LEDs and the plurality of second LEDs may be configured to operate as a same dimming block, and based on the first connection portion not electrically connecting the first LED of the plurality of first LEDs and the second LED of the plurality of second LEDs, the plurality of first LEDs and the plurality of second LEDs may be configured to operate as different dimming blocks.

The first connection portion may be configured to electrically connect the first LED of the plurality of first LEDs and the second LED of the plurality of second LEDs based on whether a jumper component is mounted on the first connection portion.

Based on the first connection portion electrically connecting the first LED of the plurality of first LEDs and the second LED of the plurality of second LEDs, the plurality of first LEDs and the plurality of second LEDs may be configured to be connected in series.

Based on the first connection portion electrically connecting the first LED of the plurality of first LEDs and the second LED of the plurality of second LEDs, the first LED may be configured to be connected to a dummy wiring that is formed on the substrate and is extended to a predetermined position connectable to a driving device.

Based on the first connection portion electrically connecting the first LED of the plurality of first LEDs and the second LED of the plurality of second LEDs, the second LED may be configured to be connected to a dummy wiring that is formed on the substrate and is extended to a predetermined position connectable to a driving power source that applies a driving voltage.

Based on the first connection portion electrically connecting the first LED of the plurality of first LEDs and the second LED of the plurality of second LEDs, a third LED of the plurality of first LEDs may be configured to be connected to a driving power source through a wiring formed on the substrate, and a fourth LED of the plurality of second LEDs may be configured to be connected to a driving device through a wiring formed on the substrate.

The plurality of first LEDs and the plurality of second LEDs may be configured to be operated with a same driving current.

Based on the first connection portion not electrically connecting the first LED of the plurality of first LEDs and the second LED of the plurality of second LEDs, the first LED may be configured to be connected to a first driving device by a wiring formed on the substrate, and the second LED may be configured to be connected to a first driving power source by a wiring formed on the substrate.

Based on the first connection portion not electrically connecting the first LED of the plurality of first LEDs and the second LED of the plurality of second LEDs, a fifth LED of the plurality of first LEDs may be configured to be connected to a second driving power source by a wiring formed on the substrate, and a sixth LED of the plurality of second LEDs may be configured to be connected to a first driving device by a wiring formed on the substrate.

Based on the first connection portion electrically connecting the first LED of the plurality of first LEDs and the second LED of the plurality of second LEDs, a fifth LED of the plurality of first LEDs may be configured to be connected to a second driving power source by a wiring formed on the substrate, and a sixth LED of the plurality of second LEDs may be configured to be connected to a second driving device by a wiring formed on the substrate.

Based on the first connection portion not electrically connecting the first LED of the plurality of first LEDs and the second LED of the plurality of second LEDs, the plurality of first LEDs and the plurality of second LEDs may be configured to be operated with different driving currents.

A number of first LEDs and a number of second LEDs may be equal to each other.

The plurality of LEDs may further include a plurality of third LEDs configured to be connected in series by a wiring formed on the substrate, and the substrate may further include a second connection portion formed between the second LED of the plurality of second LEDs and a seventh LED of the plurality of third LEDs.

The display apparatus may further include a dimming driver configured to control the light source apparatus, the plurality of LEDs may be provided on a first side of the substrate, a second side of the substrate may include a first mounting portion and a second mounting portion disposed in different positions, and only one of the first mounting portion or the second mounting portion may be configured to be connected to a connector of the dimming driver.

According to an embodiment of the disclosure, a method for manufacturing a light source apparatus may include: forming a wiring on a substrate: forming a connection portion on the substrate; and mounting a plurality of light emitting diodes (LEDs) on the substrate where the connection portion may be formed between a first LED of a plurality of first LEDs connected in series to each other by a wiring formed on the substrate, and a second LED of a plurality of second LEDs connected in series to each other by a wiring formed on the substrate, and based on the connection portion electrically connecting the first LED of the plurality of first LEDs and the second LED of the plurality of second LEDs, the plurality of first LEDs and the plurality of second LEDs may operate as a same dimming block, and based on the connection portion not electrically connecting the first LED of the plurality of first LEDs and the second LED of the plurality of second LEDs, the plurality of first LEDs and the plurality of second LEDs may operate as different dimming blocks.

BRIEF DESCRIPTION OF THE DRAWINGS

The above and other aspects, features, and advantages of certain embodiments of the present disclosure will be more apparent from the following description taken in conjunction with the accompanying drawings.

DETAILED DESCRIPTION

Figure 1:
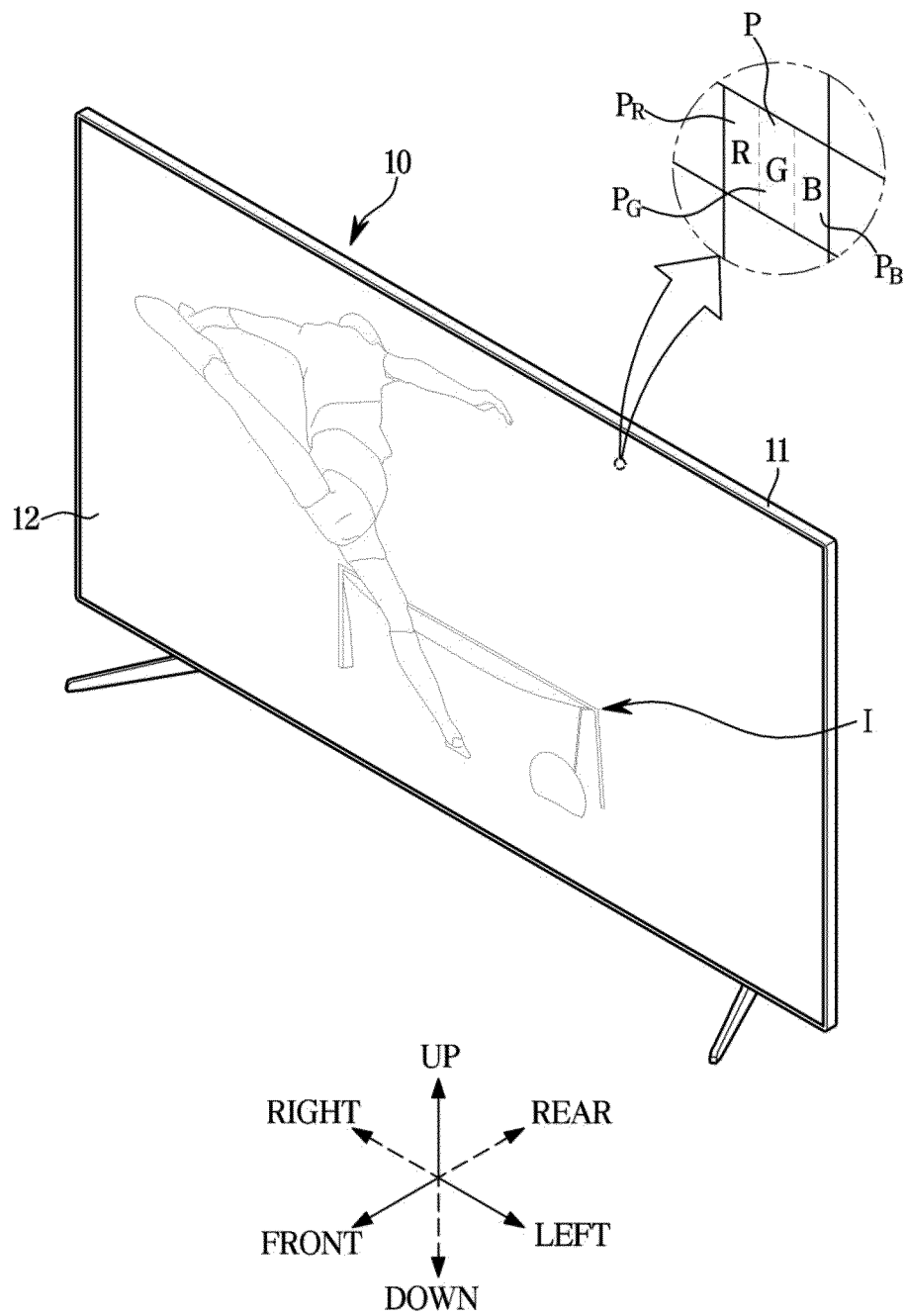
FIG. 1 illustrates an example of an appearance of a display apparatus according to an embodiment.

Embodiments described in the specification and configurations shown in the accompanying drawings are merely examples of the disclosure, and various modifications may replace the embodiments and the drawings of the disclosure at the time of filing of the application.

The terms used herein are only for the purpose of describing particular embodiments and are not intended to limit to the disclosure.

For example, a singular form of a noun corresponding to an item may include one item or a plurality of the items unless context clearly indicates otherwise.

As used herein, each of the expressions "A or B," "at least one of A and B," "at least one of A or B," "A, B, or C," "at least one of A, B, and C," and "at least one of A, B, or C," may include one or all possible combinations of the items listed together with a corresponding expression among the expressions. For example, "at least one of A or B," may include 'A', 'B', and 'A and B'. "At least one of A and B," may include 'A', 'B', and 'A and B'. In another example, "at least one of A, B, or C," may include 'A', 'B', 'C', 'A and B', 'B and C', 'A and C', and 'A, B and C', and "at least one of A, B, and C," may include 'A', 'B', 'C', 'A and B', 'B and C', 'A and C', and 'A, B and C'.

As used herein, the term "and/or" includes any and all combinations of one or more of the associated listed items. For example, the term "A, B, and/or C," may include 'A', 'B', 'C', 'A and B', 'Band C', 'A and C', and 'A, B and C'.

It will be understood that the terms "first", "second", etc., may be used only to distinguish one component from another, not intended to limit the corresponding component in other aspects (e.g., importance or order).

When it is said that one (e.g., first) component is "coupled" or "connected" to another (e.g., second) component, with or without the terms "functionally" or "communicatively", it means that one component can be connected to the other component directly (e.g., by wire), wirelessly, or through a third component.

It will be understood that when the terms "includes," "comprises," "including," and/or "comprising," when used in this specification, specify the presence of stated features, figures, steps, operations, components, members, or combinations thereof, but do not preclude the presence or addition of one or more other features, figures, steps, operations, components, members, or combinations thereof.

An expression that one component is "connected", "coupled", "supported", or "in contact" with another component includes a case in which the components are directly "connected", "coupled", "supported", or "in contact" with each other and a case in which the components are indirectly "connected", "coupled", "supported", or "in contact" with each other through a third component.

It will also be understood that when one component is referred to as being "on" or "over" another component, it can be directly on the other component or intervening components may also be present.

Further, the terms such as "~part", "~device", "~block", "~member", "~module", and the like may refer to a unit for processing at least one function or act. For example, the terms may refer to at least one process processed by at least one hardware, such as field-programmable gate array (FPGA)/application specific integrated circuit (ASIC), software stored in memories or processors.

Reference numerals used for method steps are just used for convenience of description, but not to limit an order of the steps. Thus, unless the context clearly dictates otherwise, the written order may be practiced otherwise.

Hereinafter, embodiments of the disclosure are described in detail with reference to the accompanying drawings.

FIG. 1 illustrates an example of an appearance of a display apparatus according to an embodiment.

Referring to FIG. 1, a display apparatus 10 is a device capable of processing an image signal received from the outside and visually displaying a processed image. Hereinafter, a case in which the display apparatus 10 is a television (TV) is exemplified, but is not limited thereto. For example, the display apparatus 10 may be implemented in various forms, such as a monitor, a portable multimedia device, a portable communication device, and the like, and the form of the display apparatus 10 is not limited as long as it is a device that visually displays an image.

In addition, the display apparatus 10 may be a Large Format Display (LFD) installed outdoors, such as on a roof of a building or at a bus stop. The outdoors is not necessarily limited to the outdoors, and the display apparatus 10 may be installed wherever a large number of people may enter and exit, even indoors such as at subway stations, shopping malls, movie theaters, office buildings, and stores.

The display apparatus 10 may receive content including a video signal and an audio signal from various content sources, and output video and audio corresponding to the video signal and the audio signal, respectively. For example, the display apparatus 10 may receive content data through a broadcast reception antenna or a wired cable, receive content data from a content playback apparatus, or receive content data from a content-providing server of a content provider.

As shown in FIG. 1, the display apparatus 10 may include a body 11 and a screen 12 for displaying an image I.

The body 11 forms an exterior of the display apparatus 10, and components of the display apparatus 10 for displaying the image I and performing various functions may be provided inside the body 101. It is illustrated in FIG. 1 that the body 11 has a flat plate shape, but the shape of the body 11 is not limited to the flat plate shape shown in FIG. 1. For example, the body 11 may have a curved plate shape.

The screen 12 is formed on a front surface of the body 11, and displays the image I. For example, the screen 12 may display a still image or a video, as well as a two-dimensional (2D) plane image or a three-dimensional (3D) stereoscopic image using binocular parallax of a user.

The screen 12 may include a liquid crystal panel capable of transmitting or blocking light emitted by a light source apparatus, or the like.

A plurality of pixels P may be formed on the screen 12, and the image I displayed on the screen 12 may be formed by light emitted from each of the plurality of pixels P. For example, the image I may be formed on the screen 12 by combining light emitted from the plurality of pixels P like a mosaic.

Each of the plurality of pixels P may emit light of various brightness and various colors. In order to emit light of various colors, each of the plurality of pixels P may include sub-pixels $P_R$, $P_G$, and $P_B$.

The sub-pixels $P_R$, $P_G$, and $P_B$ may include a red sub-pixel $P_R$ capable of emitting red light, a green sub-pixel $P_G$ capable of emitting green light, and a blue sub-pixel $P_B$ capable of emitting blue light. For example, the red light may represent light having a wavelength of approximately 700 nm (nanometers, one billionth of a meter) to 800 nm, the green light may represent light having a wavelength of approximately 500 nm to 600 nm, and the blue light may represent light having a wavelength of approximately 400 nm to 500 nm.

By combining the red light of the red sub-pixel $P_R$, the green light of the green sub-pixel $P_G$, and the blue light of the blue sub-pixel $P_B$, each of the plurality of pixels P may emit light of various brightness and various colors.

Figure 2:
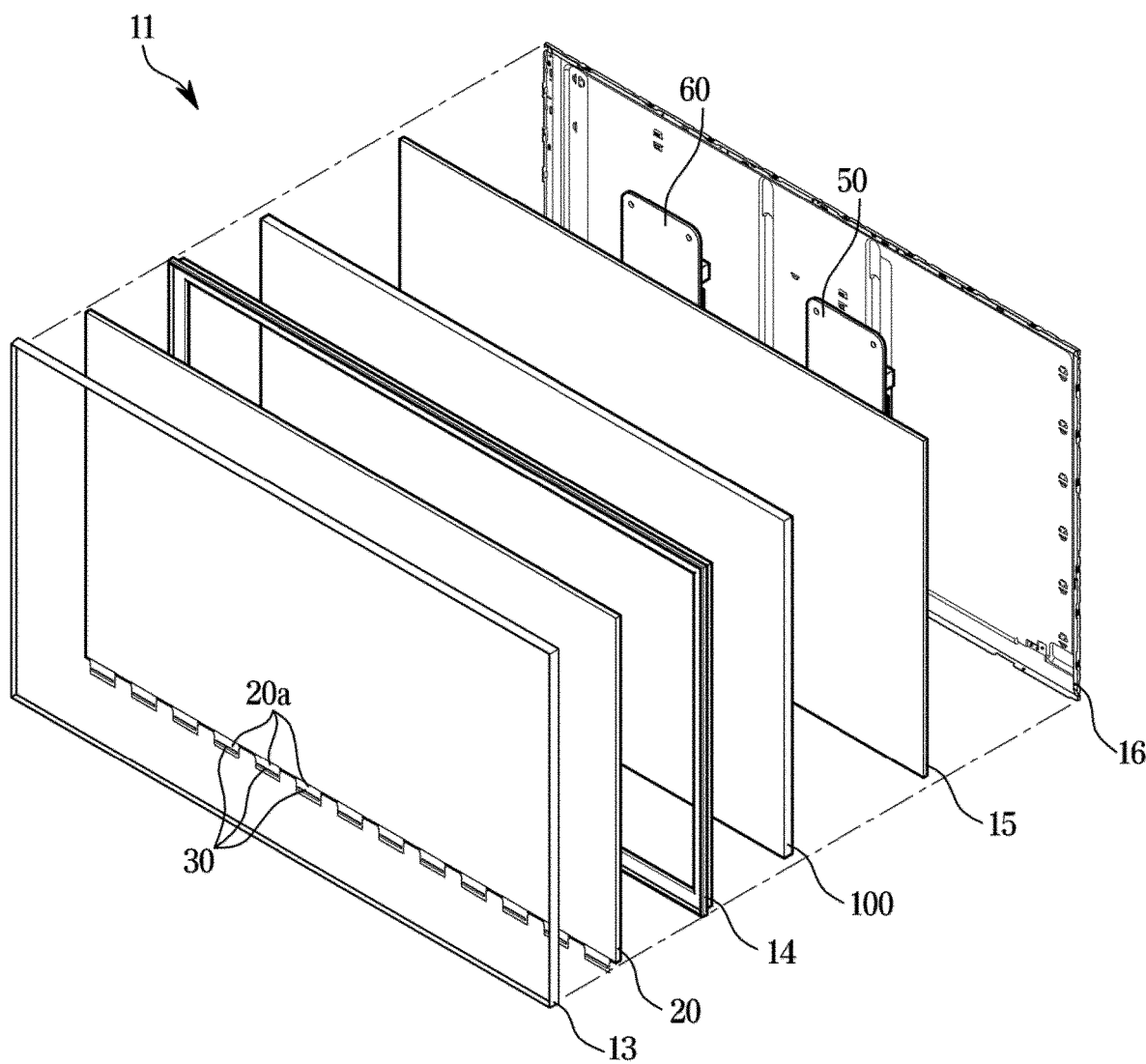
FIG. 2 illustrates an example of a configuration of a display apparatus according to an embodiment.
Figure 2:
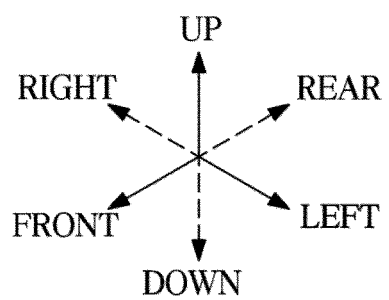
Figure 3:
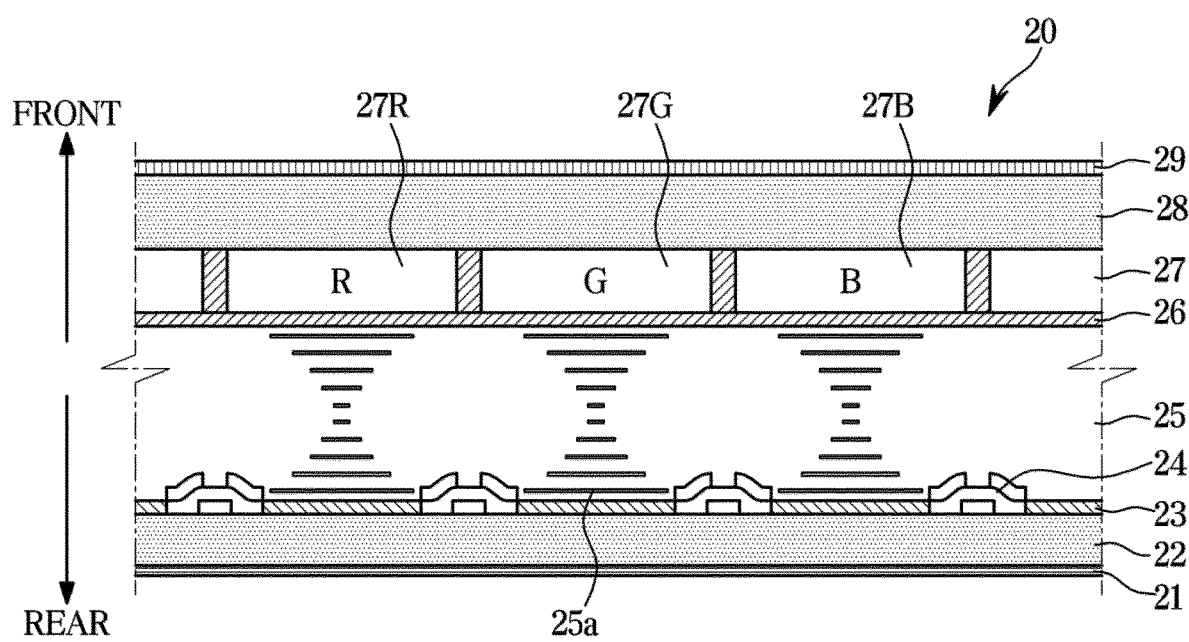
FIG. 3 illustrates an example of a liquid crystal panel included in a display apparatus according to an embodiment.

FIG. 2 illustrates an example of a configuration of a display apparatus according to an embodiment. FIG. 3 illustrates an example of a liquid crystal panel included in a display apparatus according to an embodiment.

As shown in FIG. 2, various components for generating an image I on the screen 12 may be provided in the body 11.

For example, the body 11 may include a light source apparatus 100 which is a surface light source, a liquid crystal panel 20 blocking or transmitting light emitted from the light source apparatus 100, a control assembly 50 controlling operations of the light source apparatus 100 and the liquid crystal panel 20, and a power supply assembly 60 supplying power to the light source apparatus 100 and the liquid crystal panel 20. In addition, the body 11 may include a bezel 13, a frame middle mold 14, a bottom chassis 15, and a rear cover 16 for supporting the liquid crystal panel 20, the light source apparatus 100, the control assembly 50, and the power supply assembly 60.

The light source apparatus 100 may include a point light source that emits white light, and may refract, reflect, and scatter the light to convert the light emitted from the point light source into a uniform surface light. As described above, the light source apparatus 100 may refract, reflect, and scatter the light emitted from the point light source to emit a uniform surface light in a forward direction.

The light source apparatus 100 will be described in more detail below.

The liquid crystal panel 20 may be provided in front of the light source apparatus 100, and may block or transmit light emitted from the light source apparatus 100 to form the image I.

A front surface of the liquid crystal panel 20 may form the screen 12 of the display apparatus 10 described above, and the liquid crystal panel 20 may form the plurality of pixels P. The plurality of pixels P of the liquid crystal panel 20 may independently block or transmit the light emitted from the light source apparatus 100. The light transmitted through the plurality of pixels P may form the image I to be displayed on the screen 12.

For example, as shown in FIG. 3, the liquid crystal panel 20 may include a first polarizing film 21, a first transparent substrate 22, a pixel electrode 23, a Thin-Film Transistor (TFT) 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin-film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 may be provided on outer sides of the first and second transparent substrates 22 and 28, respectively. The first polarizing film 21 and the second polarizing film 29 may each transmit specific polarized light and block (reflect or absorb) the other polarized light. For example, the first polarizing film 21 may transmit light polarized in a first direction and block (reflect or absorb) the other polarized light. In addition, the second polarizing film 29 may transmit light polarized in a second direction and block (reflect or absorb) the other polarized light. In this instance, the first direction and the second direction may be orthogonal to each other. Thus, the polarized light passing through the first polarizing film 21 may not directly pass through the second polarizing film 29.

The color filter 27 may be provided on an inner side of the second transparent substrate 28. The color filter 27 may include, for example, a red filter 27R transmitting red light, a green filter 27G transmitting green light, and a blue filter 27B transmitting blue light. In addition, the red filter 27R, the green filter 27G, and the blue filter 27B may be disposed parallel to each other. A region occupied by the color filter 27 may correspond to the pixel P described above. A region occupied by the red filter 27R may correspond to the red sub-pixel $P_R$, a region occupied by the green filter 27G may correspond to the green sub-pixel $P_G$, and a region occupied by the blue filter 27B may correspond to the blue sub-pixel $P_B$.

The color filter 27 in which the red filter 27R, the green filter 27G that passes green light, and the blue filter 27G that passes blue light are formed may be replaced with a quantum dot sheet layer.

The pixel electrode 23 may be provided on an inner side of the first transparent substrate 22, and the common electrode 26 may be provided on the inner side of the second transparent substrate 28. The pixel electrode 23 and the common electrode 26 may be formed of a metal material through which electricity is conducted and may generate an electric field for changing the arrangement of liquid crystal molecules 115a constituting the liquid crystal layer 25 to be described below.

The Thin-Film Transistor (TFT) 24 may be provided on the inner side of the second transparent substrate 22. The thin-film transistor 24 may be turned on (closed) or off (opened) by image data provided from a panel driver 30. In addition, by turning the thin-film transistor 24 on (closing) or off (opening), an electric field may be formed or removed from between the pixel electrode 23 and the common electrode 26.

The liquid crystal layer 25 may be formed between the pixel electrode 23 and the common electrode 26 and may be filled with liquid crystal molecules 25a. The liquid crystal may represent an intermediate state between a solid (crystal) and a liquid. The liquid crystal may exhibit optical properties depending on a change of the electric field. For example, an arrangement direction of the molecules constituting the liquid crystal may change depending on the change of the electric field. As a result, optical properties of the liquid crystal layer 25 may change according to the presence or absence of the electric field passing through the liquid crystal layer 25. For example, the liquid crystal layer 25 may rotate a polarization direction of light about an optical axis according to the presence or absence of the electric field. Accordingly, the polarized light that has passed through the first polarizing film 21 may be changed in polarization direction while passing through the liquid crystal layer 25 and may pass through the second polarizing film 29.

A cable 20a through which image data is transmitted to the liquid crystal panel 20 and a Display Driver Integrated circuit (DDI) 30 (hereinafter, referred to as the "panel driver") that processes digital image data and outputs an analog image signal are provided on one side of the liquid crystal panel 20.

The cable 20a may electrically connect between the control assembly 50/power supply assembly 60 and the panel driver 30, and may also electrically connect between the panel driver 30 and the liquid crystal panel 20. The cable 20a may include a flexible flat cable, a film cable, or the like that may be bendable.

The panel driver 30 may receive image data and power from the control assembly 50/the power supply assembly 60 through the cable 20a. Further, the panel driver 30 may provide image data and driving current to the liquid crystal panel 20 through the cable 20a.

In addition, the cable 20a and the panel driver 30 may be integrally implemented as a film cable, a Chip On Film (COF), a Tape Carrier Package (TCP), or the like. In other words, the panel driver 30 may be disposed on the cable 20a. However, the disclosure is not limited thereto, and the panel driver 30 may be disposed on the liquid crystal panel 20.

The control assembly 50 may include a control circuit that controls operations of the liquid crystal panel 20 and the light source apparatus 100. For example, the control circuit may process a video signal and/or an audio signal received from an external content source, transmit the image data to the liquid crystal panel 20, and transmit dimming data to the light source apparatus 100.

The power supply assembly 60 may include a power circuit supplying power to the liquid crystal panel 20 and the light source apparatus 100. The power circuit may supply power to the control assembly 50, the light source apparatus 100, and the liquid crystal panel 20.

The control assembly 50 and the power supply assembly 60 may be implemented with a printed circuit board and various circuits mounted on the printed circuit board. For example, the power circuit may include a condenser, a coil, a resistance element, a processor, and the like and a power circuit board on which these elements are mounted. In addition, the control circuit may include a memory, a processor, and a control circuit board on which these elements are mounted.

Figure 4:
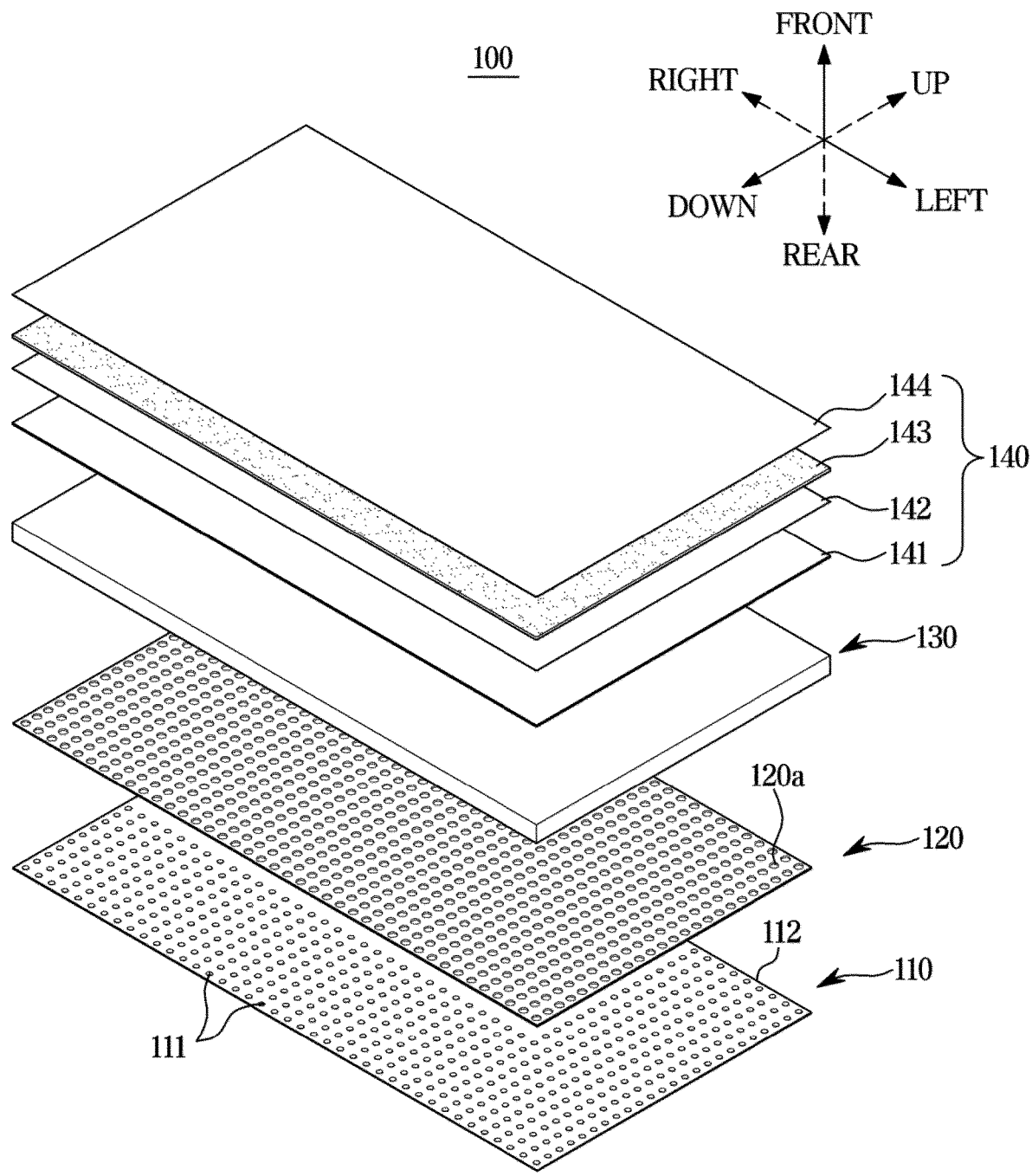
FIG. 4 illustrates an example of a light source apparatus included in a display apparatus according to an embodiment.
Figure 5:
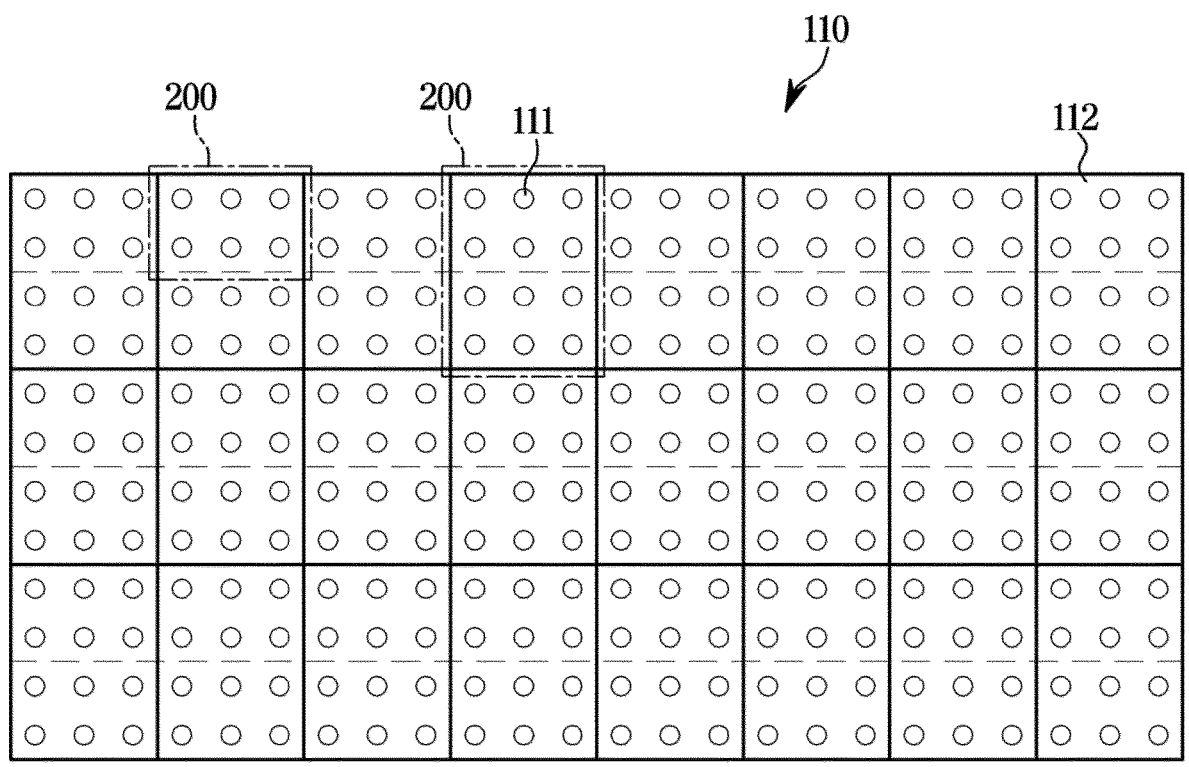
FIG. 5 is a diagram illustrating that a plurality of light sources are divided into a plurality of dimming blocks according to an embodiment.

FIG. 4 illustrates an example of the light source apparatus 100 included in a display apparatus according to an embodiment. FIG. 5 is a diagram illustrating that a plurality of light sources are divided into a plurality of dimming blocks according to an embodiment.

As shown in FIG. 4, the light source apparatus 100 may include a light source module 110 generating light, a reflector sheet 120 reflecting light, a diffuser plate 130 uniformly diffusing light, and an optical sheet 140 improving luminance of the output light.

The light source module 110 may include a plurality of light sources 111 emitting light, and a substrate 112 fixedly supporting the plurality of light sources 111.

The plurality of light sources 111 may be arranged in a predetermined pattern to allow light to be emitted with uniform luminance. The plurality of light sources 111 may be arranged to allow a distance between a single light source and each light source adjacent thereto to be the same.

For example, as shown in FIG. 4, the plurality of light sources 111 may be aligned in rows and columns. Accordingly, the plurality of light sources may be arranged to form an approximate square by four adjacent light sources. In addition, any one light source is disposed adjacent to four light sources, and a distance between the single light source and each of the four light sources adjacent to the single light source may be substantially the same.

Furthermore, according to embodiments, the plurality of light sources 111 may be arranged to allow an approximately equilateral triangle to be formed by three adjacent light sources. In this case, a single light source may be disposed adjacent to six light sources, and a distance between the single light source and each of the six adjacent light sources may be approximately the same.

However, the arrangement in which the plurality of light sources 111 are disposed is not limited to the arrangement described above, and the plurality of light sources 111 may be disposed in various patterns to allow light to be emitted with uniform luminance.

The light source 111 may employ an element capable of emitting monochromatic light (light having a specific range of wavelengths, for example, blue light) or white light (for example, mixed light of red light, green light, and blue light) in various directions by receiving power. For example, the light source 111 may include a Light Emitting Diode (LED). The LED may be implemented in a variety of sizes and may include, for example, Mini LEDs and/or Micro LEDs.

The substrate 112 may fix the plurality of light sources 111 to prevent positions of the light sources 111 from being changed. In addition, the substrate 112 may supply each light source 111 with power for the light source 111 to emit light.

The substrate 112 may fix the plurality of light sources 111. The substrate 112 may include a synthetic resin and/or tempered glass and/or a Printed Circuit Board (PCB) on which a conductive power feed line for supplying power to the light source 111 is formed.

Various types of wiring may be formed on the substrate 112 to supply power to the light source 111. In order to form various types of wiring on the substrate 112, the printed circuit board may be formed of a plurality of layers.

The reflector sheet 120 may allow light emitted from the plurality of light sources 111 to be reflected forward or in a direction close to the forward direction.

A plurality of through holes 120a corresponding respectively to the plurality of light sources 111 of the light source module 110 may be formed in the reflector sheet 120. The light sources 111 of the light source module 110 may pass through the through holes 120a and protrude forward of the reflector sheet 120.

For example, in an assembly process of the reflector sheet 120 and the light source module 110, the plurality of light sources 111 of the light source module 110 are inserted into the plurality of through holes 120a formed in the reflector sheet 120. As a result, the substrate 112 of the light source module 110 may be located at the rear of the reflector sheet 120, but the plurality of light sources 111 of the light source module 110 may be located at the front of the reflector sheet 120.

Accordingly, the plurality of light sources 111 may emit light in front of the reflector sheet 120.

The plurality of light sources 111 may emit light in front of the reflector sheet 120 in various directions. Light may be emitted from the light source 111 not only toward the diffuser plate 130, but also toward the reflector sheet 120, and the reflector sheet 120 may reflect the light emitted toward the reflector sheet 120 toward the diffuser plate 130.

The light emitted from the light source 111 may pass various objects such as the diffuser plate 130, the optical sheet 140, and the like. When the light passes the diffuser plate 130 and the optical sheet 140, a portion of the incident light is reflected from surfaces of the diffuser plate 130 and the optical sheet 140. The reflector sheet 120 may reflect the light reflected by the diffuser plate 130 and the optical sheet 140.

The diffuser plate 130 may be disposed in front of the light source module 110 and the reflector sheet 120 to uniformly disperse the light emitted from the light source 111 of the light source module 110.

As described above, the plurality of light sources 111 may be located on a rear surface of the light source apparatus 100. The plurality of light sources 111 are equidistantly arranged on the rear surface of the light source apparatus 100, but differences in luminance may exist depending on the positions of the plurality of light sources 111.

To eliminate the difference in luminance due to the plurality of light sources 111, the diffuser plate 130 may diffuse the light emitted from the plurality of light sources 111 within the diffuser plate 130. In other words, the diffuser plate 130 may uniformly emit non-uniform light forward from the plurality of light sources 111.

The optical sheet 140 may include various sheets for improving luminance or luminance uniformity. For example, the optical sheet 140 may include a diffuser sheet 141, a first prism sheet 142, a second prism sheet 143, a reflective polarizing sheet 144, and the like.

The diffuser sheet 141 diffuses light for uniformity of luminance. The light emitted from the light source 111 may be diffused by the diffuser plate 130 and then diffused again by the diffuser sheet 141 included in the optical sheet 140.

The first and second prism sheets 142 and 143 may concentrate the light diffused by the diffuser sheet 141, thereby increasing the luminance. The first and second prism sheets 142 and 143 may have triangular prism patterns arranged adjacent to each other to form a plurality of bands.

The reflective polarizing sheet 144 may be a kind of polarizing film, and may transmit a portion of the incident light, and reflect other portions to improve luminance. For example, the reflective polarizing sheet 144 may transmit light polarized in the same direction as a predetermined polarization direction of the reflective polarizing sheet 144 and reflect light polarized in a different direction from the predetermined polarization direction. In addition, the light reflected by the reflective polarizing sheet 144 may be reused within the light source apparatus 100, and such light reuse may improve the luminance of the display apparatus 10.

The optical sheet 140 is not limited to the sheets or films shown in FIG. 4, and may further include a variety of sheets or films such as protective sheets, films, and the like.

The light source apparatus 100 may include the plurality of light sources 111, and may output surface light by diffusing the light emitted from the plurality of light sources 111. The liquid crystal panel 20 may include a plurality of pixels, and the plurality of pixels may be controlled to allow each of the plurality of pixels to transmit and/or block light. An image may be formed by light passing through each of the plurality of pixels.

In this instance, the display apparatus 10 may perform local dimming to vary a brightness of light for each region of the light source apparatus 100 in association with the output image to improve power consumption while increasing contrast.

For example, the display apparatus 10 may reduce the brightness of light of the light source 111 of the light source apparatus 100 corresponding to a dark portion of an image to make the dark portion of the image darker, and may increase the brightness of light of the light source 111 of the light source apparatus 100 corresponding to a bright portion of the image to make the bright portion of the image brighter. As a result, a contrast ratio of the image may be improved.

The light source apparatus 100 included in the display apparatus 10 may be divided into a plurality of blocks, and for each block, the current may be adjusted independently according to an input image. Image transmission of the display apparatus 10 is performed through local dimming drives frame-by-frame, and the current driving is adjusted according to the number of divided blocks of the light sources 111 in the light source apparatus 100.

As a result, the display apparatus 10 may effectively improve a contrast ratio by lowering a supply current to the dimming blocks corresponding to regions where the input image is dark and increasing the supply current to the dimming blocks corresponding to regions where the input image is bright.

For local dimming, the plurality of light sources 111 included in the light source apparatus 100 may be divided into a plurality of dimming blocks 200.

According to various embodiments, the k number of light sources 111 may be classified into n dimming blocks or m dimming blocks (k, n, m are natural numbers). For example, the k number of light sources 111 may be classified (divided) into n dimming blocks, each of which includes k/n light sources 111. Here, k/n refers to k divided by n. In another example, the k number of light sources 111 may be classified (divided) into m dimming blocks, each of which includes k/m light sources 111. Here, k/m refers to k divided by m, n and m may be different from each other, and k may be a multiple of n and m.

For example, when k is 120, n may be 20, m may be 10, and the 120 light sources 111 may be classified into 20 dimming blocks, each of which includes 6 light sources 111, or may be classified into 10 dimming blocks, each of which includes 12 light sources 111.

The k/n number of light sources 111 or the k/m number of light sources 111 included in each dimming block may be arranged in a matrix form. A matrix in which the k/n number of light sources 111 or the k/m number of light sources 111 included in each dimming block are arranged may have the same number of rows or the same number of columns.

According to various embodiments, k/n may be 9 or less, and k/m may be 12 or more. That is, the plurality of light sources 111 may be divided into dimming blocks, each of which includes 9 or less LEDs or includes 12 or more LEDs.

Referring to FIG. 5, each of the plurality of dimming blocks 200 may include at least one light source 111. The light source apparatus 100 may supply the same driving current to the light sources 111 belonging to the same dimming block 200, and the light sources 111 belonging to the same dimming block 200 may emit light of the same brightness.

In addition, the light source apparatus 100 may supply different driving currents to the light sources 111 belonging to different dimming blocks 200 according to dimming data, and the light sources 111 belonging to different dimming blocks 200 may emit light of different brightness.

Each of the plurality of dimming blocks 200 may include, for example, N*M light sources arranged in an N*M matrix (N, M are natural numbers). An N*M matrix refers to a matrix with N rows and M columns.

Because each of the light sources 111 includes an LED, each of the plurality of dimming blocks 200 may include N*M LEDs. According to various embodiments, N*M may be equal to k/n or k/m.

According to various embodiments, each of the light sources 111 may further include an optical dome or an optical lens. The optical dome may cover the LED. The optical dome may prevent or suppress damage to the LED due to external mechanical action and/or due to chemical action.

A thickness of the light source apparatus 100 may also be thinner to allow the display apparatus 10 to be thinner. To reduce the thickness of the light source apparatus 100, each of the plurality of light sources 111 becomes thinner and a structure thereof is simplified.

The LED constituting the light source 111 may be directly attached to the substrate 112 using a Chip On Board (COB) method. For example, the light source 111 may include an LED in which an LED chip or an LED die is directly attached to the substrate 112 without separate packaging.

The LED constituting the light source 111 may be manufactured as a flip-chip type. In the flip-chip type LED, when an LED, which is a semiconductor element, is attached to the substrate 112, an electrode pattern of the semiconductor element may be directly fused to the substrate 112 without using an intermediate medium, such as a metal lead (wire) or a Ball Grid Array (BGA). As described above, because the metal lead (wire) or BGA is omitted, the light source 111 including the flip-chip type LED may be miniaturized.

Although the flip-chip type LED directly fused to the substrate 112 in a chip on board method has been described above, the light source 111 is not limited to the flip-chip type LED. For example, the light source 111 may include a package-type LED.

The plurality of dimming blocks 200 may be disposed on the substrate 112. That is, N*M light emitting diodes may be disposed on the substrate 112.

Figure 6:
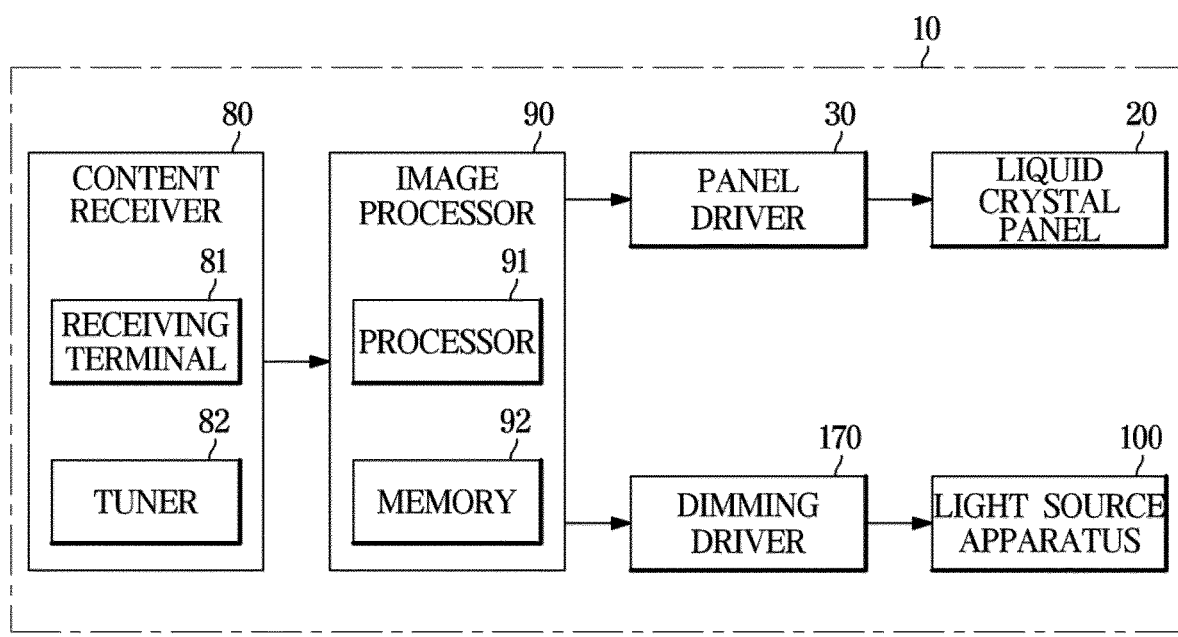
FIG. 6 is a control block diagram illustrating a display apparatus according to an embodiment.

FIG. 6 is a control block diagram illustrating a display apparatus according to an embodiment.

As shown in FIG. 6, the display apparatus 10 may include a content receiver 80, an image processor 90, a panel driver 30, the liquid crystal panel 20, a dimming driver 170, and the light source apparatus 100.

The content receiver 80 may include a tuner 82 and a receiving terminal 81 receiving content including a video signal and/or audio signal from content sources.

The receiving terminal 81 may receive the video signal and audio signal from content sources through a cable. For example, the receiving terminal 81 may include a component (YPbPr/RGB) terminal, a Composite Video Blanking and Sync (CVBS) terminal, an audio terminal, a High Definition Multimedia Interface (HDMI) terminal, and a Universal Serial Bus (USB) terminal.

The tuner 82 may receive a broadcast signal from a broadcast reception antenna or a wired cable. In addition, the tuner 82 may extract a broadcast signal of a channel selected by a user from among broadcast signals. For example, the tuner 82 may pass a broadcast signal having a frequency corresponding to the channel selected by the user among a plurality of broadcast signals received through the broadcast reception antenna or wired cable, and may block a broadcast signal having a frequency different from the frequency corresponding to the channel selected by the user.

As described above, the content receiver 80 may receive the video signal and/or audio signal from the content sources through the receiving terminal 81 and/or the tuner 82. The content receiver 80 may output the video signal and/or audio signal received through the receiving terminal 81 and/or the tuner 82 to the image processor 90.

The image processor 90 may include a processor 91 processing image data, and a memory 92 storing programs and data for processing the image data.

The memory 92 may store programs and data for processing a video signal and/or an audio signal. In addition, the memory 92 may temporarily store data generated while processing the video signal and/or audio signal.

The memory 92 may include a non-volatile memory such as Read Only Memory (ROM) and flash memory, and a volatile memory such as Static Random Access Memory (S-RAM), Dynamic Random Access Memory (D-RAM), and the like.

The processor 91 may receive the video signal and/or audio signal from the content receiver 80. The processor 91 may decode the video signal into image data. The processor 91 may generate dimming data from the image data. In addition, the processor 91 may output the image data and the dimming data to the panel driver 30 and the dimming driver 170, respectively.

As such, the image processor 90 may generate the image data and the dimming data from the video signal obtained by the content receiver 80. The image processor 90 may also transmit the image data and the dimming data to the liquid crystal panel 20 and the light source apparatus 100, respectively.

The image data may include information about an intensity of light transmitted by each of a plurality of pixels (or a plurality of subpixels) included in the liquid crystal panel 20. The image data may be provided to the liquid crystal panel 20 through the panel driver 30.

The liquid crystal panel 20 may include a plurality of pixels capable of transmitting or blocking light, and the plurality of pixels are arranged in a matrix form. In other words, the plurality of pixels may be arranged in a plurality of rows and a plurality of columns.

The panel driver 30 may receive the image data from the image processor 90. The panel driver 30 may drive the liquid crystal panel 20 according to the image data. In other words, the panel driver 30 may convert image data, which is a digital signal (hereinafter, referred to as 'digital image data'), into an analog image signal, which is an analog voltage signal. The panel driver 30 may provide the converted analog image signal to the liquid crystal panel 20. Optical properties (e.g., light transmittance) of the plurality of pixels included in the liquid crystal panel 20 may change according to the analog image signal.

The panel driver 30 may include, for example, a timing controller, a data driver, a scan driver, and the like.

The timing controller may receive the image data from the image processor 90. The timing controller may output image data and a drive control signal to the data driver and the scan driver. The drive control signal may include a scan control signal and a data control signal. The scan control signal and the data control signal may be used to control operations of the scan driver and the data driver, respectively.

The scan driver may receive a scan control signal from the timing controller. The scan driver may activate any one of the plurality of rows in the liquid crystal panel 20 according to the scan control signal. In other words, the scan driver may convert a state of pixels included in a single row among the plurality of pixels arranged in the plurality of rows and the plurality of columns, into a state capable of receiving an analog image signal. In this instance, other pixels except for the pixels activated by the scan driver may not receive the analog image signal.

The data driver may receive the image data and the data control signal from the timing controller. The data driver may output the image data to the liquid crystal panel 20 according to the data control signal. For example, the data driver may receive the digital image data from the timing controller. The data driver may convert the digital image data into an analog image signal. In addition, the data driver may provide the analog image signal to the pixels included in any one row activated by the scan driver. In this instance, the pixels activated by the scan driver may receive the analog image signal. Optical properties (e.g., light transmittance) of the activated pixels may change according to the received analog image signals.

As described above, the panel driver 30 may drive the liquid crystal panel 20 according to image data. As a result, an image corresponding to the image data may be displayed on the liquid crystal panel 20.

The dimming driver 170 may control the light source apparatus 100.

Dimming data may include information about an intensity of light emitted by each of the plurality of light sources (or the plurality of dimming blocks) included in the light source apparatus 100. The dimming data may be provided to the light source apparatus 100 through the dimming driver 170.

The light source apparatus 100 may include the plurality of light sources 111 that emit light. The plurality of light sources 111 are arranged in a matrix form. In other words, the plurality of light sources 111 may be arranged in a plurality of rows and a plurality of columns.

The light source apparatus 100 may be divided into a plurality of dimming blocks 200. In addition, each of the plurality of dimming blocks 200 may include at least one light source.

The light source apparatus 100 may output surface light by diffusing light emitted from the plurality of light sources 111. The liquid crystal panel 20 may include a plurality of pixels, and may control each of the plurality of pixels to pass or block light. An image may be formed by light passing through each of the plurality of pixels.

In this instance, the light source apparatus 100 may turn off a plurality of light sources corresponding to a dark part of the image in order to make the dark part of the image darker. Accordingly, the dark part of the image becomes darker, thereby improving a contrast ratio of the image.

As described above, the light source apparatus 100 controls the plurality of light sources to emit light in an area corresponding to a bright part of the image and controls the plurality of light sources not to emit light in an area corresponding to the dark part of the image, which is hereinafter referred to as "local dimming".

For local dimming, the plurality of light sources 111 included in the light source apparatus 100 may be divided into a plurality of dimming blocks 200, as shown in FIG. 5. In FIG. 5, a total of 60 dimming blocks in five rows and twelve columns are shown, but the number and arrangement of dimming blocks are not limited to the number and arrangement of the dimming blocks shown in FIG. 5.

Each of the plurality of dimming blocks 200 may include at least one light source 111. The light source apparatus 100 may supply the same driving current to light sources belonging to the same dimming block 200, and the light sources belonging to the same dimming block 200 may emit light of the same brightness. For example, light sources belonging to the same dimming block 200 are connected to each other in series, and thus the same driving current may be supplied to the light sources belonging to the same dimming block 200.

Figure 7:
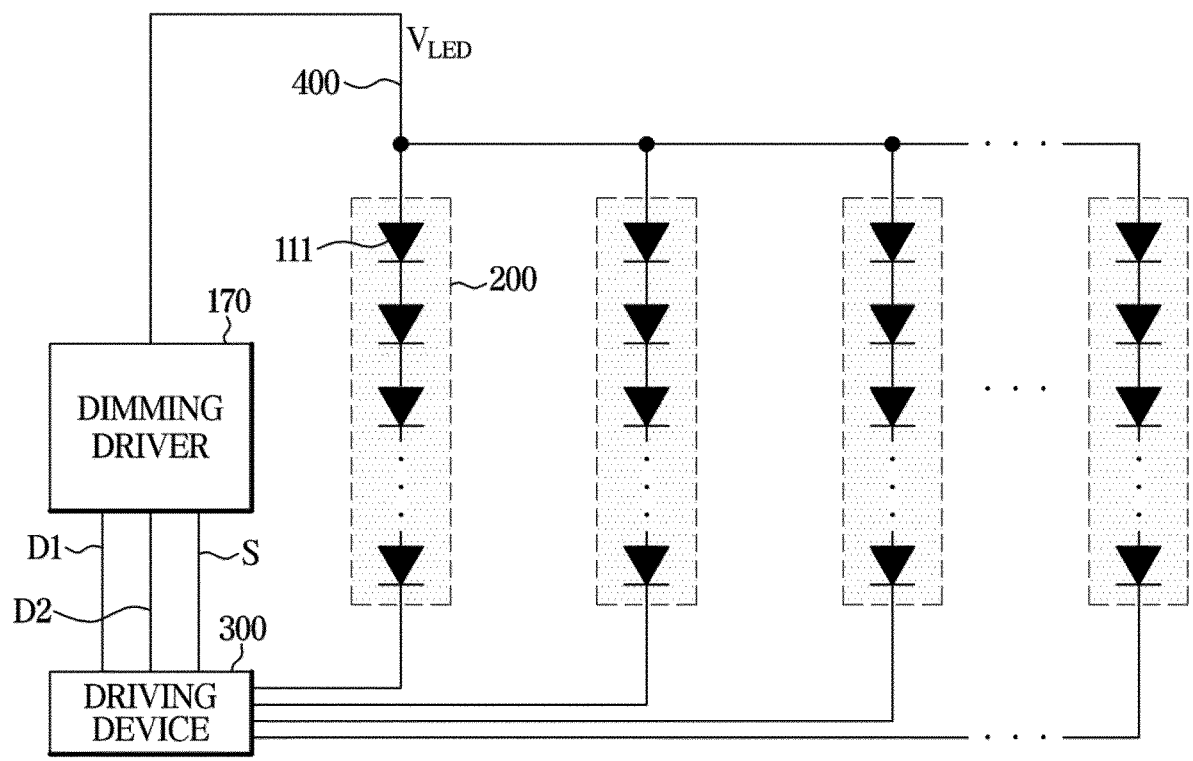
FIG. 7 illustrates a connection structure among a dimming driver, a driving device, and a dimming block according to an embodiment.

In addition, the light source apparatus 100 may further include a plurality of driving devices 300 controlling driving current supplied to light sources included in each of the plurality of dimming blocks 200 (see, FIG. 7). The driving devices 300 may be provided to correspond to at least a single dimming block 200 each. In other words, each of the driving devices 300 may drive each of the dimming blocks 200.

The driving device 300 may include an integrated circuit chip for controlling a driving current applied to the at least one dimming block 200.

As described above, because light sources belonging to a dimming block are connected to each other in series, the light sources included in the dimming block may operate as one unit and form a light source block.

Accordingly, hereinafter, "supplying a driving current to a dimming block" may be interpreted as "supplying a driving current to light sources included in a dimming block".

Although dimming blocks each including nine light sources are shown in FIG. 5, the number and arrangement of light sources included in each dimming block are not limited to the number and arrangement of the light sources shown in FIG. 5.

As described above, the image processor 90 may provide dimming data for local dimming to the dimming driver 170. The dimming data may include information about a luminance of each of the plurality of dimming blocks 200. For example, the dimming data may include information about an intensity of light output by the light sources included in each of the plurality of dimming blocks 200.

The image processor 90 may obtain the dimming data from the image data.

The image processor 90 may convert the image data into the dimming data in various manners. For example, the image processor 90 may divide an image I based on the image data into a plurality of image blocks. The number of image blocks is equal to the number of dimming blocks 200, and the plurality of image blocks may correspond to the plurality of dimming blocks 200, respectively.

The image processor 90 may obtain luminance values of the plurality of dimming blocks 200 from the image data of the plurality of image blocks. The image processor 90 may also generate the dimming data by combining the luminance values of the plurality of dimming blocks 200.

For example, the image processor 90 may obtain a luminance value of each of the plurality of dimming blocks 200 based on a maximum value among luminance values of pixels included in each of the image blocks.

A single image block includes a plurality of pixels, and image data of a single image block may include image data of a plurality of pixels (e.g., red data, green data, blue data, etc.). The image processor 90 may calculate the luminance value of each of the pixels based on the image data of each of the pixels.

The image processor 90 may determine the maximum value among the luminance values of pixels included in an image block as a luminance value of the dimming block 200 corresponding to the image block. For example, the image processor 90 may determine a maximum value among luminance values of pixels included in the $i^{th}$ image block as a luminance value of the $i^{th}$ dimming block, and may determine a maximum value among luminance values of pixels included in the $j^{th}$ image block as a luminance value of the $j^{th}$ dimming block.

The image processor 90 may generate dimming data by combining the luminance values of the plurality of dimming blocks 200.

The dimming driver 170 may receive the dimming data from the image processor 90. The dimming driver 170 may drive the light source apparatus 100 according to the dimming data. Here, the dimming data may include information about a luminance of each of the plurality of dimming blocks 200 or information about a brightness of the light sources included in each of the plurality of dimming blocks 200.

The dimming driver 170 may convert the dimming data, which is a digital voltage signal, into an analog driving current.

For example, the dimming driver 170 may sequentially provide an analog dimming signal to the driving devices 300 corresponding respectively to the dimming blocks 200, in an active matrix method.

The plurality of dimming blocks 200 may be divided into a plurality of groups. A driving current may be supplied simultaneously to the dimming blocks 200 belonging to the same group, and a driving current may be supplied sequentially at different times to the dimming blocks 200 belonging to different groups. The dimming driver 170 may activate the dimming blocks 200 belonging to any one of the plurality of groups, and provide an analog dimming signal to the activated dimming blocks. Thereafter, the dimming driver 170 may activate the dimming blocks 200 belonging to another group and provide an analog dimming signal to the activated dimming blocks. For example, the dimming blocks located in the same row may belong to the same group, and the dimming blocks located in different rows may belong to different groups, but the group classification method is not limited thereto. The dimming driver 170 may activate the dimming blocks 200 belonging to a single group and provide an analog dimming signal to the activated dimming blocks. Thereafter, the dimming driver 170 may activate the dimming blocks in another row and provide an analog dimming signal to the activated dimming blocks.

The plurality of dimming blocks 200 may be divided into a plurality of groups, each of which is connected to the same driving device 300. For example, the plurality of dimming blocks 200 may be divided into a first group of dimming blocks connected to a first driving device and a second group of dimming blocks connected to a second driving device.

A driving circuit of each of the dimming blocks 200 may provide an analog driving current corresponding to an analog dimming signal to the light source module 110. The light sources 111 included in the light source module 110 may emit light by the analog driving current. The light sources belonging to the same dimming block may emit light of the same intensity according to the dimming data. In addition, the light sources belonging to different dimming blocks may emit light of different intensities according to the dimming data.

FIG. 7 illustrates a connection structure among a dimming driver, a driving device, and a dimming block according to an embodiment.

Referring to FIG. 7, each of the plurality of dimming blocks may include a plurality of light sources 111 (LEDs) connected to each other in series.

For example, assuming that a single dimming block 200 includes a first LED, a second LED, a third LED, and a fourth LED, an anode of the first LED may be connected to a power wiring, a cathode of the first LED may be connected to an anode of the second LED, a cathode of the second LED may be connected to an anode of the third LED, a cathode of the third LED may be connected to an anode of the fourth LED, and a cathode of the fourth LED may be connected to the driving device 300.

That is, among the plurality of light sources 111 included in the single dimming block 200 and connected in series, the first light source 111 in the series connection may be connected to the power wiring 400 to receive power (the driving voltage $V_{LED}$), and the last light source 111 in the series connection may be connected to the driving device 300.

The driving device 300 may receive an analog dimming signal from the dimming driver 170 while activated by the dimming driver 170, and store the received analog dimming signal. In addition, while inactivated, the plurality of driving devices 300 may supply a driving current corresponding to the stored analog dimming signal to the plurality of light sources (plurality of LEDs) 111.

The driving device 300 may control the driving current supplied to each of the plurality of dimming blocks 200 in a state where the driving voltage $V_{LED}$ is applied to the plurality of dimming blocks 200.

To this end, the display apparatus 10 may include a plurality of scan lines S for providing scan signals to the plurality of driving devices 300 and a plurality of data lines D1 and D2 for providing analog dimming signals to the plurality of driving devices 300.

In addition, the display apparatus 10 may include a power wiring for providing a driving voltage to the plurality of driving devices 300.

The plurality of scan lines S, the plurality of data lines D1 and D2, and the power wiring 400 may be formed on the substrate 112.

The plurality of driving devices 300 may include circuits with various topologies to implement active matrix driving.

For example, each of the plurality of driving devices 300 may include a circuit with one capacitor two transistor (1C2T) topology. However, the circuit structure of the driving device 300 is not limited thereto. For example, the driving device 300 may include a 3T1C topology circuit with an additional transistor to compensate for a body effect of a driving transistor.

For example, the driving device 300 may be provided as a single chip with an integrated driving circuit. In other words, a driving circuit may be integrated into one semiconductor chip.

The dimming driver 170 may transmit dimming data corresponding to an input image to the plurality of driving devices 300 through the data lines D1 and D2.

In addition, the dimming driver 170 may transmit a timing signal corresponding to a light emission time of the plurality of dimming blocks 200 to the plurality of driving devices 300 through the scan line S.

The plurality of driving devices 300 may control the driving current supplied to each of the plurality of dimming blocks 200 based on the dimming data and the timing signal.

In FIG. 7, only a portion of the plurality of dimming blocks 200 are shown. For local dimming, the display apparatus 10 according to an embodiment requires more dimming blocks 200, driving devices 300, data lines D1 and D2, scan lines S and power wiring 400 connecting the driving devices 300 and the dimming blocks 200.

In an embodiment, a wiring may include the data lines D1 and D2, the scan lines S, the power wiring 400, wirings (hereinafter referred to as 'control wiring') that connect the plurality of driving devices 300 and the plurality of dimming blocks 200, and wirings (hereinafter referred to as 'block wiring') that connect the plurality of light sources, but the types of wiring are not limited thereto. For example, the wiring may include a wiring (hereinafter referred to as 'timing wiring') that connect the plurality of driving devices 300.

In addition, the wiring may be formed on the substrate 112 (e.g., a printed circuit board). As such, wirings that perform various functions may be formed on the substrate 112.

Conventionally, two types of substrates were required to classify the k number of light sources into the n number of dimming blocks or the m number of dimming blocks.

For example, in order to classify 120 LEDs into 20 dimming blocks, a wiring for connecting 6 LEDs in series is required to be formed on the substrate, and in order to classify 120 LEDs into 10 dimming blocks, a wiring for connecting 12 LEDs in series is required to be formed on the substrate.

That is, conventionally, because the number of LEDs included in each dimming block varies depending on a resolution of display apparatus, various substrates were required for various resolutions of display apparatus.

As will be described later, according to the disclosure, a display apparatus having different resolutions may be manufactured using a single type of substrate.

That is, according to the disclosure, by mounting a driving device and an electronic device (or electronic element, or electronic component) (e.g., a jumper) on a single type of substrate, a first light source apparatus in which a plurality of light sources may be classified into n dimming blocks and a second light source apparatus in which a plurality of light sources may be classified into m dimming blocks may be manufactured.

Figure 8:
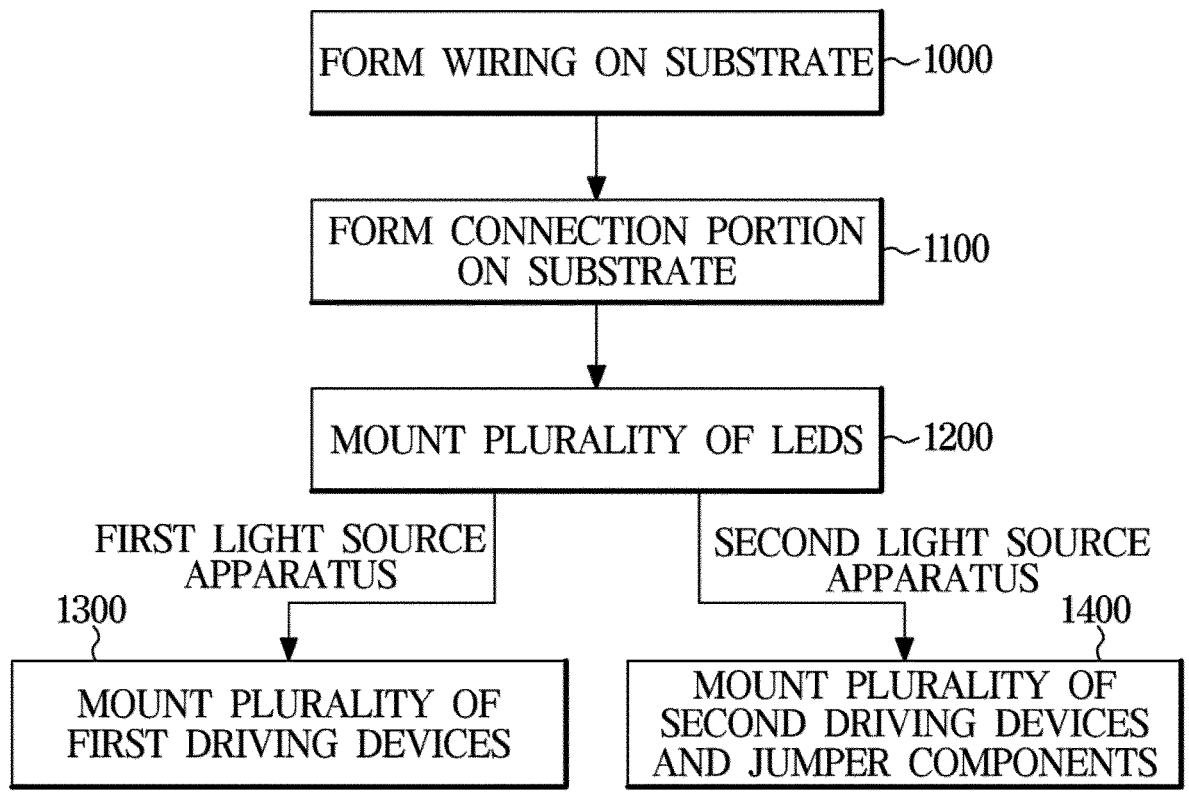
FIG. 8 illustrates a method for manufacturing a substrate for a light source apparatus according to an embodiment.

FIG. 8 illustrates a method for manufacturing a substrate for a light source apparatus according to an embodiment.

A method for manufacturing the substrate 112 for a light source apparatus according to an embodiment may include forming a wiring on the substrate 112 (1000). The substrate 112 may include a printed circuit board.

The wiring formed on the substrate 112 may include at least one of a dimming wiring for connecting the plurality of LEDs 111 in series, a control wiring for connecting the plurality of LEDs 111 and the driving device 300, a power wiring for connecting the plurality of LEDs 111 and a driving power source, a timing wiring, a data wiring, or a source wiring.

The method for manufacturing the substrate 112 for light source apparatus according to an embodiment may include forming a connection portion on the substrate 112 (1100).

In an embodiment, the connection portion may refer to a part that may be treated as an electrical path or a non-electrical path depending on whether an electronic device (e.g., a jumper component) is mounted. For example, the connection portion may include solder mask opening.

The connection portion may be electrically connected or electrically blocked depending on whether a jumper component is mounted.

The solder mask opening may include an outer layer of the substrate 112 without a mask. The solder mask opening may expose the wiring formed on the substrate 112 to tin (solder). Electronic devices may be mounted on the solder mask opening. However, an example of the connection portion is not limited thereto, and any part that may be treated as an electrical path or a non-electrical path depending on whether an electronic device (e.g., a jumper component) is mounted may be interpreted as a connection portion.

The forming of the wiring on the substrate 112 (1000) and the forming of the connection portion (1100) may be performed in any order during the manufacturing process of the substrate 112.

For example, the connection portion may be formed while the wiring is formed on the substrate 112, the connection portion may be formed after the wiring is formed on the substrate 112, or the wiring may be formed after the connection portion is formed on the substrate 112.

According to various embodiments, the wiring and/or the connection portion may be formed on a first side of the substrate 112.

Figure 9:
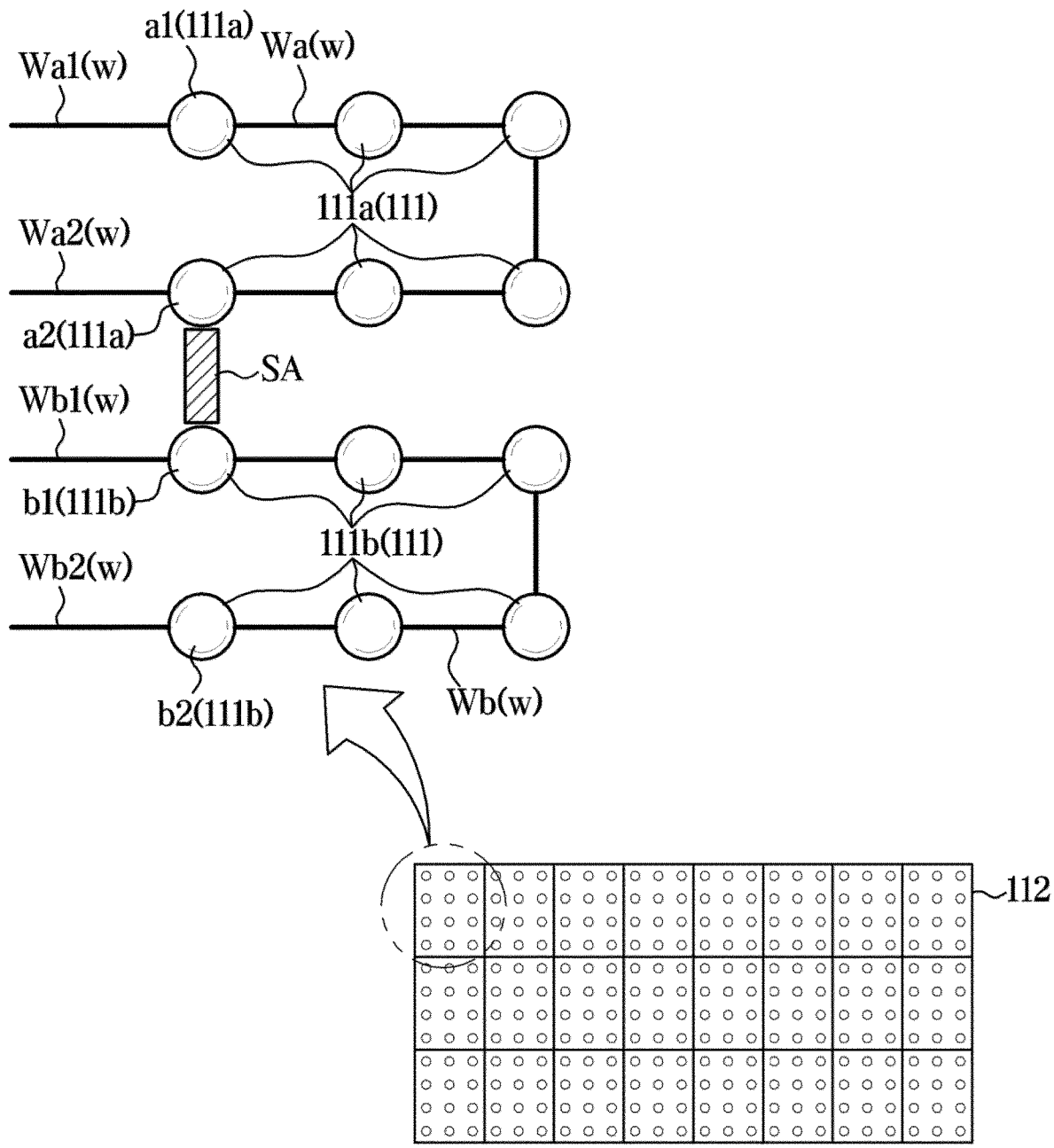
FIG. 9 illustrates an example of a substrate for a light source apparatus according to an embodiment.

According to various embodiments, the connection portion may be formed between a dimming wiring for connecting the plurality of first LEDs 111a in series and a dimming wiring for connecting the plurality of second LEDs 111b in series (see, e.g., FIG. 9).

The substrate 112 may include a connection portion formed between any one LED of the plurality of first LEDs 111a and any one LED of the plurality of second LEDs 111b.

Depending on whether the connection portion is electrically connected or blocked, the number of dimming blocks 200 formed on the substrate 112 and the number of LEDs 111 included in each dimming block may vary. The electrical connection of the connection portion may indicate that the connection portion is treated as an electrical path, and the electrical blocking of the connection portion may indicate that the connection portion is treated as a non-electrical path.

The substrate 112 may be provided as a single-layer or as a multi-layer.

At least one electronic component may be mounted on the substrate 112. The electronic components may be mounted on the substrate 112 using an Insert Mount Technology (IMT) or Surface Mount Technology (SMT), without being limited thereto. The electronic components may include an LED.

The method for manufacturing the substrate 112 for a light source apparatus according to an embodiment may include mounting the plurality of LEDs 111 on the substrate 112 on which the wiring and/or the connection portion is formed (1200).

The plurality of LEDs 111 may be mounted on the first side of the substrate 112.

The plurality of LEDs 111 may be arranged in a matrix form, and may be classified into a plurality of groups connected to each other in series by a wiring formed on the substrate 112.

The plurality of LEDs 111 belonging to each of the plurality of groups may be connected to each other in series by a wiring formed on the substrate 112, and may be electrically disconnected from LEDs belonging to another group.

The plurality of LEDs 111 belonging to each of the plurality of groups may be arranged in a matrix form.

The plurality of groups may be arranged in a matrix form on the substrate 112.

According to various embodiments, at least one LED of the plurality of LEDs 111 belonging to each of the plurality of groups may be connected to a wiring extended to a predetermined position. For example, the predetermined position may include a position where the driving device 300 may be mounted and/or a position connectable to a driving power source.

In an embodiment, an anode of any one LED of the plurality of LEDs 111 belonging to each of the plurality of groups may be connected to a wiring extended to a predetermined position connectable to a driving power source, and a cathode of the any one LED may be connected to another LED. In an embodiment, a cathode of any one LED of the plurality of LEDs 111 belonging to each of the plurality of groups may be connected to a wiring extended to a predetermined position where the driving device 300 may be mounted, and an anode of the any one LED may be connected to another LED.

Figure 10:
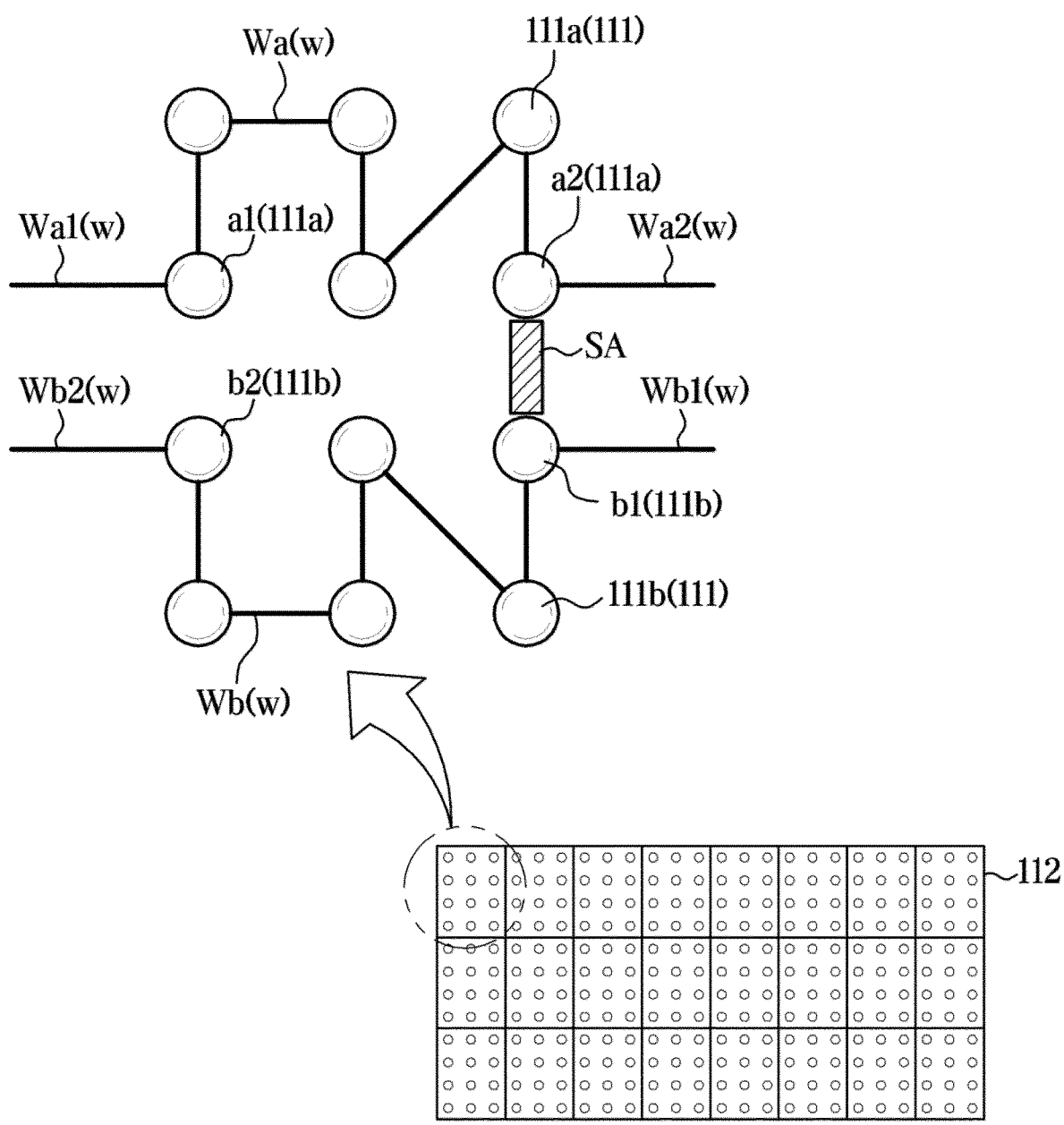
FIG. 10 illustrates an example of a substrate for a light source apparatus according to an embodiment.

FIG. 9 illustrates an example of a substrate for a light source apparatus according to an embodiment. FIG. 10 illustrates an example of a substrate for a light source apparatus according to an embodiment.

Referring to FIG. 9 and FIG. 10, the plurality of LEDs 111 may include the plurality of first LEDs 111a connected in series to each other by a wiring w formed on the substrate 112, and the plurality of second LEDs 111b connected in series to each other by a wiring w formed on the substrate 112.

The plurality of first LEDs 111a may belong to a first group, and the plurality of second LEDs 111b may belong to a second group.

As shown in FIG. 9 or FIG. 10, the first group and the second group may be adjacent to each other in a column direction, but the positional relationship between the first group and the second group is not limited thereto. For example, the first group and the second group may be adjacent to each other in a row direction.

The plurality of first LEDs 111a may be connected in series to each other by the wiring w (e.g., a first dimming wiring Wa) formed on the substrate 112. The plurality of second LEDs 111b may be connected in series to each other by the wiring w (e.g., a second dimming wiring Wb) formed on the substrate 112.

Any one LED a1 (hereinafter referred to as 'third LED') among the plurality of first LEDs 111a may be connected to a wiring Wa1 extended to a predetermined position. According to various embodiments, the predetermined position may be a position where the driving device 300 may be mounted or a position connectable to a driving power source.

Another LED a2 (hereinafter referred to as 'first LED') among the plurality of first LEDs 111a may be connected to a wiring Wa2 extended to a predetermined position. According to various embodiments, the predetermined position may be a position connectable to a driving power source or a position where the driving device 300 may be mounted.

Any one LED b1 (hereinafter referred to as 'second LED') among the plurality of second LEDs 111b may be connected to a wiring Wb1 extended to a predetermined position. According to various embodiments, the predetermined position may be a position where the driving device 300 may be mounted or a position connectable to a driving power source.

Another LED b2 (hereinafter referred to as 'fourth LED') among the plurality of second LEDs 111b may be connected to a wiring Wb2 extended to a predetermined position. According to various embodiments, the predetermined position may be a position connectable to a driving power source or a position where the driving device 300 may be mounted.

In a case where the first group and the second group are adjacent to each other in the column direction, a connection portion SA may be formed between the first group and the second group. In a case where the first group and the second group are adjacent to each other in the row direction, a connection portion SA may be formed between the first group and the second group.

The connection portion SA may be formed between the first LED a2 and the second LED b1.

For example, in a case where the plurality of first LEDs 111a are arranged at an upper side and the plurality of second LEDs 111b are arranged at a lower side, the connection portion SA may be formed between any one LED in the lowest row among the plurality of first LEDs 111a and any one LED in the uppermost row among the plurality of second LEDs 111b.

In another example, in a case where the plurality of first LEDs 111a are arranged on the left and the plurality of second LEDs 111b are arranged on the right, the connection portion SA may be formed between any one LED in the rightmost column among the plurality of first LEDs 111a and any one LED in the leftmost column among the plurality of second LEDs 111b.

In an embodiment, the connection portion SA may be formed between the first LED a2 connected to the wiring Wa2 extended to the predetermined position among the plurality of first LEDs 111a, and the second LED b1 connected to the wiring Wb1 extended to the predetermined position from among the plurality of second LEDs 111b. By the wiring w formed on the substrate, any one of an anode or a cathode of each of the first LED a2 and the second LED b1 may be connected to another LED, and the other of the anode or the cathode of each of the first LED a2 and the second LED b1 may be connected to a component other than an LED.

According to various embodiments, as shown in FIG. 9, the wirings Wa and Wb for connecting the plurality of LEDs 111 in series may connect all the LEDs in the same row in a horizontal direction. Accordingly, the wirings Wa and Wb for connecting the plurality of LEDs 111 in series may be formed in a zigzag pattern oriented in the vertical direction.

However, the arrangement of the wirings Wa and Wb for connecting the plurality of LEDs 111 in series is not limited thereto, and various arrangements to connect the plurality of LEDs 111 in series may be implemented.

For example, as shown in FIG. 10, the wirings Wa and Wb for connecting the plurality of LEDs 111 in series may connect all the LEDs in the same column in the vertical direction. Accordingly, the wirings Wa and Wb for connecting the plurality of LEDs 111 in series may be formed in a zigzag pattern oriented in the horizontal direction.

An electronic device (e.g., a jumper component) may be mounted on the connection portion SA in the subsequent manufacturing processes.

Figure 11:
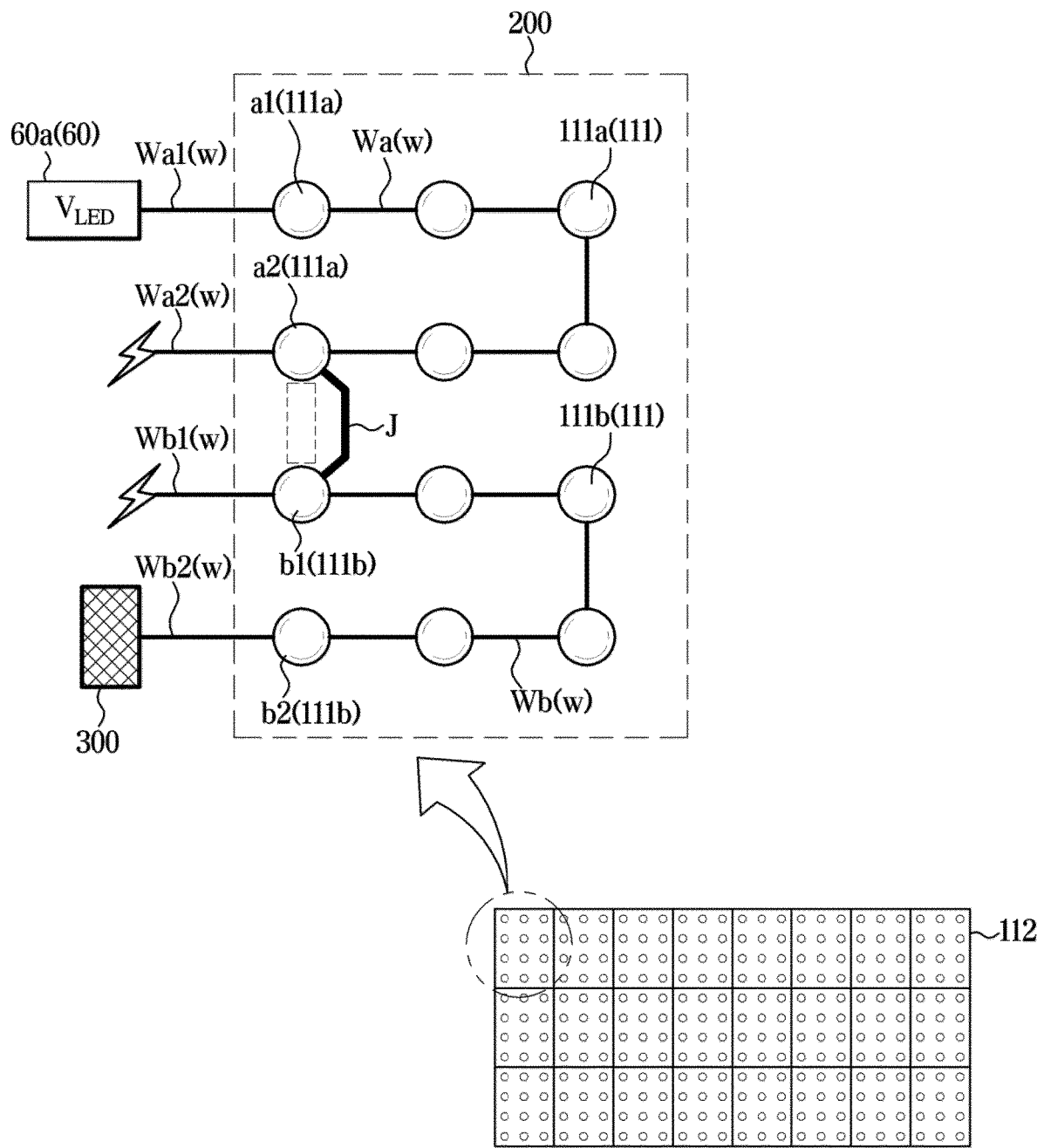
FIG. 11 illustrates an example where the substrate for the light source apparatus shown in FIG. 9 is used as a second light source apparatus.

A jumper component J may be mounted on the connection portion SA (see, e.g., FIG. 11). The jumper component J may refer to a conductor soldered to the connection portion SA of the substrate 112 to electrically connect two points.

By mounting the jumper component J on the connection portion SA, the first LED a2 connected to the wiring Wa2 extended to the predetermined position among the plurality of first LEDs 111a and the second LED b1 connected to the wiring Wb1 extended to the predetermined position may be electrically connected. Accordingly, the plurality of first LEDs 111a and the plurality of second LEDs 111b may be connected in series to each other and may form a single group (or dimming block 200).

According to various embodiments, any one of the wiring Wa2 extended to the predetermined position among the plurality of first LEDs 111a and the wiring Wb1 extended to the predetermined position among the plurality of second LEDs 111b may be extended to a position connectable to a driving power source that applies a driving voltage to an LED, and the other one may be extended to a position where the driving device 300 may be mounted.

For example, the wiring Wa2 extended to the predetermined position among the plurality of first LEDs 111a may be extended to the position connectable to the driving power source, and the wiring Wb1 extended to a predetermined position among the plurality of second LEDs 111b may be extended to the position where the driving device 300 may be mounted. Accordingly, the wiring Wa1 extended to the predetermined position among the plurality of first LEDs 111a may be extended to the position where the driving device 300 may be mounted, and the wiring Wb2 extended to the predetermined position among the plurality of second LEDs 111b may be extended to the position connectable to the driving power source.

In another example, the wiring Wb1 extended to the predetermined position among the plurality of second LEDs 111b may be extended to the position connectable to the driving power source, and the wiring Wa2 extended to the predetermined position among the plurality of first LEDs 111a may be extended to the position where the driving device 300 may be mounted. Accordingly, the wiring Wa1 extended to the predetermined position among the plurality of first LEDs 111a may be extended to the position connectable to the driving power source, and the wiring Wb2 extended to the predetermined position among the plurality of second LEDs 111b may be extended to the position connectable to the driving device 300.

According to various embodiments, in a case where the jumper component J is not mounted on the connection portion SA, the plurality of first LEDs 111a and the plurality of second LEDs 111b are electrically blocked, and may be operated as different dimming blocks 200. In a case where the jumper component J is mounted on the connection portion SA, the plurality of first LEDs 111a and the plurality of second LEDs 111b are electrically connected, and may operate as the same dimming block 200.

Although FIG. 9 and FIG. 10 show only the plurality of first LEDs 111a and the plurality of second LEDs 111b, the substrate 112 may include a plurality of LEDs 111 having the same relationship as a relationship between the plurality of first LEDs 111a and the plurality of second LEDs 111b.

In an embodiment, based on the connection portion SA being electrically blocked, i.e. not electrically connecting the plurality of first LEDs 111a and the plurality of second LEDs 111b, the plurality of first LEDs 111a and the plurality of second LEDs 111b may operate as different dimming blocks. The plurality of first LEDs 111a and the plurality of second LEDs 111b operate as different dimming blocks, which may indicate that the plurality of first LEDs 111a and the plurality of second LEDs 111b are operated with different driving currents. That is, the plurality of first LEDs 111a and the plurality of second LEDs 111b operating as different dimming blocks may indicate that the plurality of first LEDs 111a and the plurality of second LEDs 111b may emit light at different timings.

In an embodiment, based on the connection portion SA being electrically connected, the plurality of first LEDs 111a and the plurality of second LEDs 111b may operate as the same dimming block. The plurality of first LEDs 111a and the plurality of second LEDs 111b operate as the same dimming block, which may indicate that the plurality of first LEDs 111a and the plurality of second LEDs 111b are operated with the same driving current. That is, the plurality of first LEDs 111a and the plurality of second LEDs 111b operating as the same dimming block may indicate that the plurality of first LEDs 111a and the plurality of second LEDs 111b emit light at the same timing.

According to various embodiments, the number of first LEDs 111a and the number of second LEDs 111b may be the same. For example, the number of first LEDs 111a and the number of second LEDs 111b may each ben (e.g., 6). In this instance, the total number of LEDs 111 on the substrate 112 may be k (e.g., 1200), which is a multiple of 2n. In addition, the number of groups of n LEDs 111 connected to each other may be k/n. As a result, depending on whether the jumper component J is mounted on the connection portion SA, the substrate 112 may include k/n (e.g., 200) dimming blocks 200 or k/2n (e.g., 100) dimming blocks 200. In this instance, any n and k may be used as long as they are numbers that satisfy the above conditions.

As a resolution of the display apparatus 10 improves, the number of dimming blocks 200 required increases. Accordingly, in a case where a resolution of the display apparatus 10 is a first resolution (e.g., 8K), the light source apparatus 100 may be manufactured without mounting the jumper component J on the connection portion SA, thereby forming k/n dimming blocks 200. In a case where the resolution of the display apparatus 10 is a second resolution (e.g., 4K) lower than the first resolution, the light source apparatus 100 including the connection portion SA on which the jumper component J is mounted may be manufactured, thereby forming k/2n dimming blocks 200.

Referring back to FIG. 8, through the operation 1000, operation 1100, and operation 1200, the substrate 112 on which the wiring w and the connection portion SA are formed and the plurality of LEDs 111 are mounted may be manufactured.

The substrate 112 on which the wiring w and the connection portion SA are formed and the plurality of LEDs 111 are mounted may be used in the subsequent manufacturing process of the display apparatus 10. For example, when it is desired to manufacture the display apparatus 10 having the first resolution, the substrate 112 may be manufactured as the substrate 112 for the first light source apparatus through a process of manufacturing the first light source apparatus 100. In another example, when it is desired to manufacture the display apparatus 10 having the second resolution lower than the first resolution, the substrate 112 may be manufactured as the substrate 112 for the second light source apparatus through a process of manufacturing the second light source apparatus 100.

The process of manufacturing the first light source apparatus 100 may include mounting a plurality of first driving devices 300 on the substrate 112 (1300).

Positions where the plurality of first driving devices 300 are to be mounted may be designed in advance. For example, the plurality of first driving devices 300 may be mounted at a predetermined position connectable to any one of the plurality of first LEDs 111a through the wiring Wa1 or Wa2, and may be mounted at a predetermined position connectable to any one of the plurality of second LEDs 111b through the wiring Wb1 or Wb2.

The process of manufacturing the second light source apparatus 100 may include mounting a plurality of jumper components J and a plurality of second driving devices 300 on the substrate 112 (1400).

Positions where the plurality of second driving devices 300 are to be mounted may be designed in advance. For example, the plurality of second driving devices 300 may be mounted at a predetermined position connectable to any one of the plurality of first LEDs 111a through the wiring Wa1, or may be mounted at a predetermined position connectable to any one of the plurality of second LEDs 111b through the wiring Wb2.

According to various embodiments, the first light source apparatus 100 has a greater number of dimming blocks 200 than the second light source apparatus 100, and thus the first light source apparatus 100 may require a greater number of driving devices 300 than the second light source apparatus 100.

According to various embodiments, the positions where the plurality of second driving devices 300 are to be mounted may or may not be included in the positions where the plurality of first driving devices 300 are to be mounted.

For example, the plurality of second driving devices 300 mounted on the second light source apparatus 100 may be part of the plurality of first driving devices 300.

Based on the connection portion SA being electrically connected, the substrate 112 may include a plurality of first dimming blocks. Based on the connection portion SA being electrically blocked, the substrate 112 may include a plurality of second dimming blocks. The number of first dimming blocks may be less than the number of second dimming blocks. The number of LEDs 111 included in each of the plurality of first dimming blocks may be greater than the number of LEDs 111 included in each of the plurality of second dimming blocks.

According to the disclosure, by forming the connection portion SA between the plurality of first LEDs 111a and the plurality of second LEDs 111b, the number of dimming blocks 200 (or the number of LEDs included in the dimming block 200) on the substrate 112 may be designed in the manufacturing process.

According to the disclosure, a single substrate 112 may be used to manufacture the display apparatuses 10 having different resolutions.

According to the disclosure, ease of management of the substrate 112 may be increased.

Figure 12:
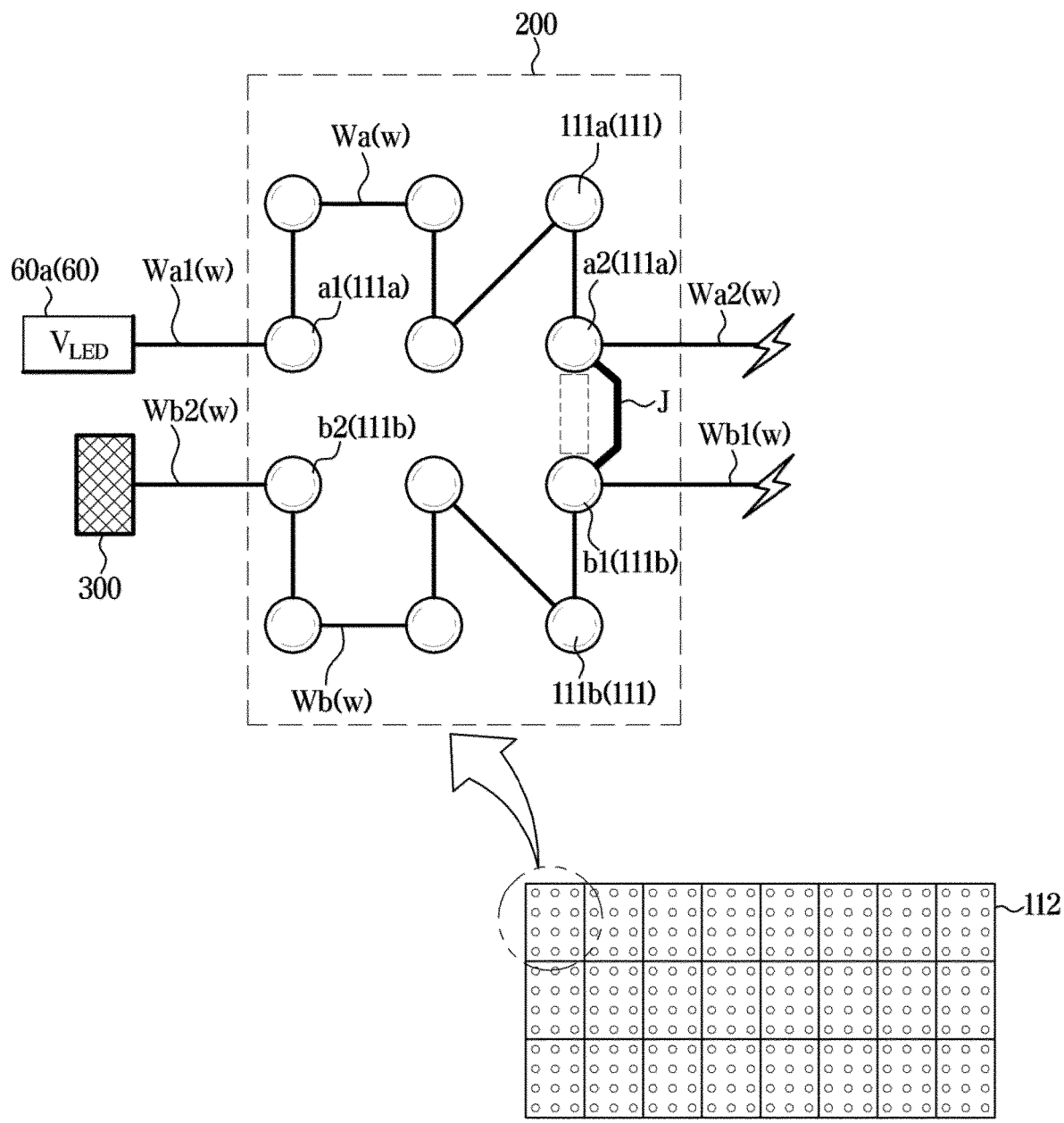
FIG. 12 illustrates an example where the substrate for the light source apparatus shown in FIG. 10 is used as a second light source apparatus.

FIG. 11 illustrates an example where the substrate for the light source apparatus shown in FIG. 9 is used as a second light source apparatus. FIG. 12 illustrates an example where the substrate for the light source apparatus shown in FIG. 10 is used as a second light source apparatus.

Referring to FIG. 11 and FIG. 12, the second light source apparatus 100 may be connected to the control assembly 50/power supply assembly 60 of the display apparatus 10.

The control assembly 50/power supply assembly 60 of the display apparatus 10 may include the dimming driver 170 (see FIG. 6).

The dimming driver 170 may include a driving power source 60a that applies a driving voltage $V_{LED}$. The dimming driver 170 may transmit a control signal for controlling the driving device 300 through a wiring w formed on the substrate 112.

The second light source apparatus 100 may include a jumper component J connecting the plurality of first LEDs 111a and the plurality of second LEDs 111b.

The first LED a2 and the second LED b1 may be connected by the jumper component J, thereby allowing the plurality of first LEDs 111a and the plurality of second LEDs 111b to be connected in series.

As the first LED a2 and the second LED b1 are connected by the jumper component J, the wiring Wa2 connected to the first LED a2 may become redundant. Here, redundant wiring is defined as a dummy wiring. The first LED a2 may be connected to the dummy wiring Wa2 extended to a predetermined position. Because the dummy wiring Wa2 is not connected to any component, the dummy wiring Wa2 may be treated as an open circuit.

As the first LED a2 and the second LED b1 are connected by the jumper component J, the wiring Wb1 connected to the second LED b1 may become redundant. The second LED b1 may be connected to the dummy wiring Wb1 extended to a predetermined position. Because the dummy wiring Wb1 is not connected to any component, the wiring Wb1 may be treated as an open circuit.

The third LED a1 of the plurality of first LEDs 111a may be connected to the driving power source 60a through the wiring Wa1 formed on the substrate 112.

The fourth LED b2 of the plurality of second LEDs 111b may be connected to the driving device 300 through the wiring Wb2 formed on the substrate 112.

According to various embodiments, the third LED a1 of the plurality of first LEDs 111a may be connected to the driving device 300 through the wiring Wa1 formed on the substrate 112, and the fourth LED b2 of the plurality of second LEDs 111b may be connected to the driving power source 60a through the wiring Wb2 formed on the substrate 112.

A current flowing through the plurality of first LEDs 111a may flow to the plurality of second LEDs 111b. Accordingly, the plurality of first LEDs 111a and the plurality of second LEDs 111b may operate as a single dimming block 200. For example, in a case where the plurality of first LEDs 111a are controlled to emit light of a first brightness, the plurality of second LEDs 111b may also be controlled to emit light of the first brightness.

The driving power source 60a may apply a driving voltage $V_{LED}$ to the dimming block 200 including the plurality of first LEDs 111a and the plurality of second LEDs 111b.

The driving device 300 may control the current flowing through the dimming block 200 including the plurality of first LEDs 111a and the plurality of second LEDs 111b.

According to the disclosure, in a case where the jumper component J is mounted on the connection portion SA formed between the plurality of first LEDs 111a and the plurality of second LEDs 111b, by the wiring formed on the substrate 112, any one LED of the plurality of first LEDs 111a may be connected to the driving power source 60a and any one LED of the plurality of second LEDs 111b may be connected to the driving device 300, and thus the plurality of first LEDs 111a and the plurality of second LEDs 111b may operate as a single dimming block 200.

Figure 13:
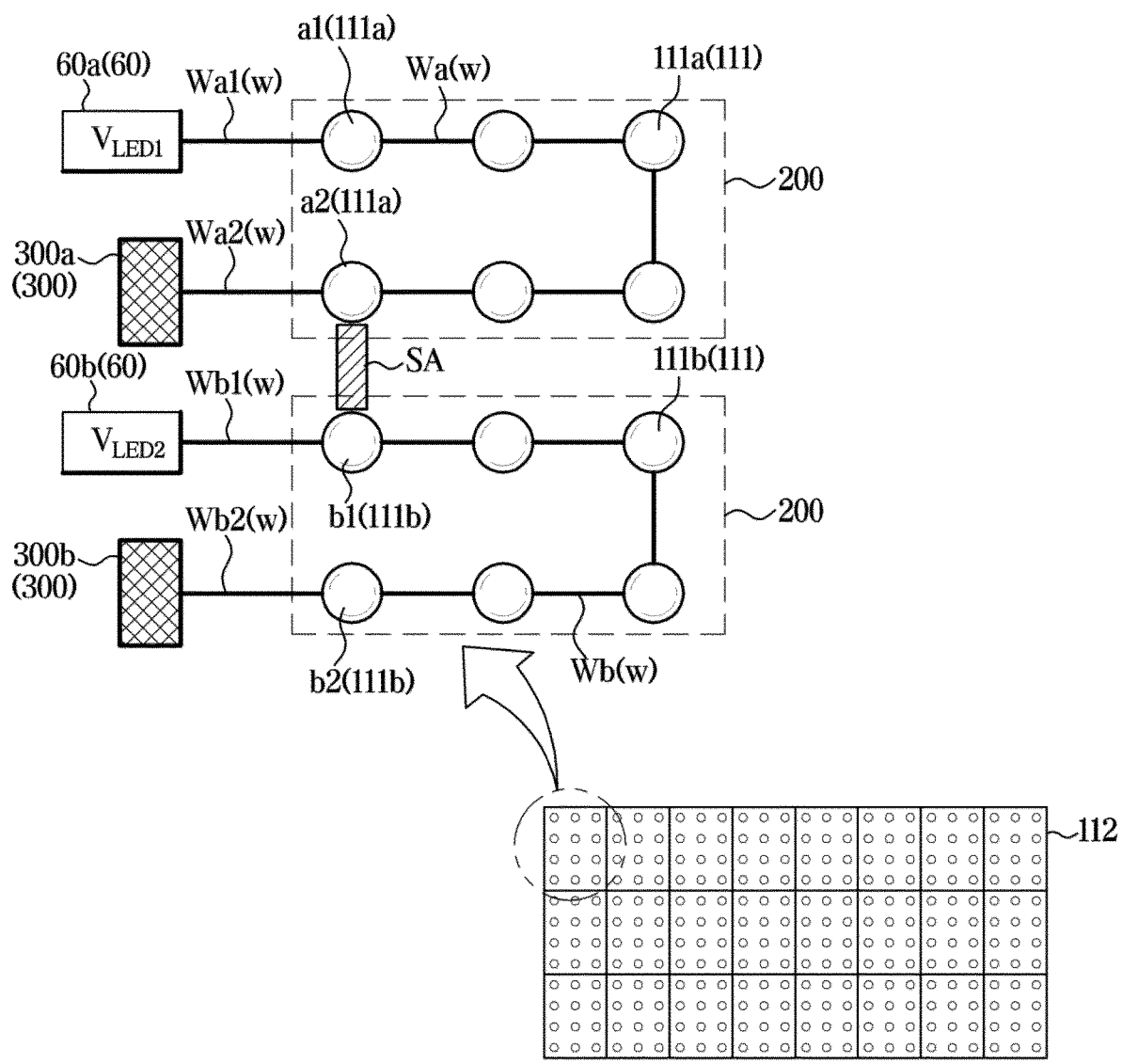
FIG. 13 illustrates an example where the substrate for the light source apparatus shown in FIG. 9 is used as a first light source apparatus.
Figure 14:
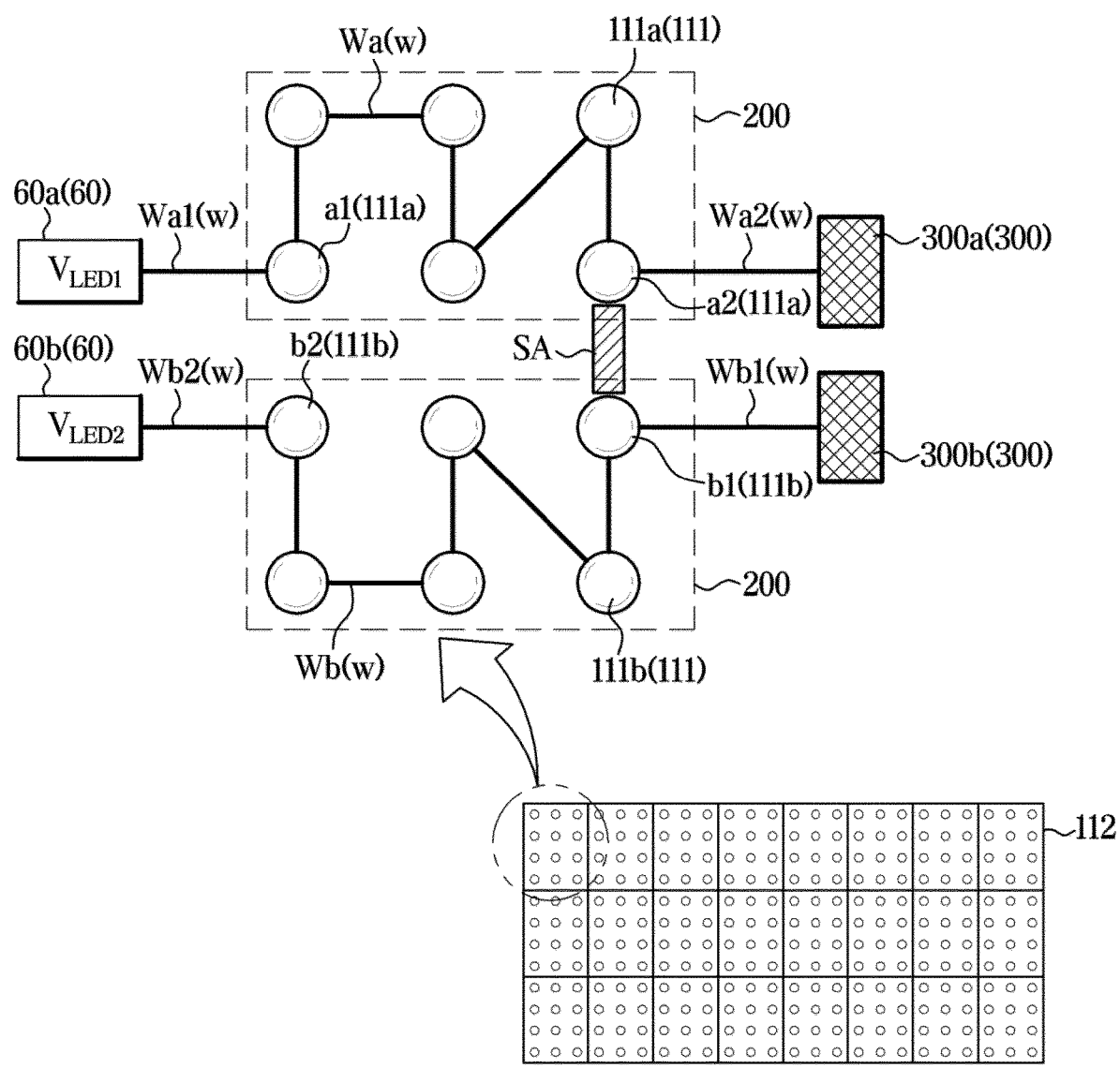
FIG. 14 illustrates an example where the substrate for the light source apparatus shown in FIG. 10 is used as a first light source apparatus.

FIG. 13 illustrates an example where the substrate for the light source apparatus shown in FIG. 9 is used as a first light source apparatus. FIG. 14 illustrates an example where the substrate for the light source apparatus shown in FIG. 10 is used as a first light source apparatus.

Referring to FIG. 13 and FIG. 14, the first light source apparatus 100 may be connected to the control assembly 50/power supply assembly 60 of the display apparatus 10.

The control assembly 50/power supply assembly 60 of the display apparatus 10 may include the dimming driver 170.

The dimming driver 170 may include at least one driving power source (60a, 60b) that applies a driving voltage ($V_{LED1}$, $V_{LED2}$). According to various embodiments, in order to perform time-division driving control for the dimming blocks 200 arranged in alternating rows, the display apparatus 10 may include the first driving power source 60a, that applies the first driving voltage $V_{LED1}$ to the dimming blocks 200 arranged in even rows (or odd rows), and the second driving power source 60b that applies the second driving voltage $V_{LED2}$ arranged in an odd rows (or even rows).

According to various embodiments, the display apparatus 10 may also include only one driving power source in order to supply the same driving voltage to the dimming blocks 200 arranged in all rows. That is, the first driving power source 60a and the second driving power source 60b may be the same power source.

The dimming driver 170 may transmit a control signal for controlling the driving device 300 through the wiring w formed on the substrate 112.

A jumper component J connecting the plurality of first LEDs 111a and the plurality of second LEDs 111b may not be mounted on the first light source apparatus 100. Accordingly, a connection portion SA may be formed between the plurality of first LEDs 111a and the plurality of second LEDs 111b. According to various embodiments, the connection portion SA may be removed by soldering in manufacturing the first light source apparatus 100.

Because the jumper component J is not mounted on the first light source apparatus 100, the plurality of first LEDs 111a and the plurality of second LEDs 111b may be electrically blocked from each other.

Any one LED of the plurality of first LEDs 111a may be connected to the first driving power source 60a through the wiring Wa1 formed on the substrate 112, and another LED of the plurality of first LEDs 111a may be connected to the first driving device 300a through the wiring Wa2 formed on the substrate 112.

Any one LED of the plurality of second LEDs 111b may be connected to the second driving power source 60b through the wiring Wb1 formed on the substrate 112, and another LED of the plurality of second LEDs 111b may be connected to the second driving device 300b through the wiring Wb2 formed on the substrate 112.

According to the embodiment, the plurality of first LEDs 111a and the plurality of second LEDs 111b may operate as different dimming blocks 200. For example, in a case where the plurality of first LEDs 111a are controlled to emit light of a first brightness, the plurality of second LEDs 111b may be controlled to emit light of a second brightness different from the first brightness.

Although it is shown in FIG. 13 and FIG. 14 that the first driving device 300a and the second driving device 300b are separate configurations, the first driving device 300a and the second driving device 300b may be the same driving device 300, or may be different driving devices 300. For example, the driving device 300 that controls a driving current supplied to the dimming block 200 formed by the plurality of first LEDs 111a may also control a driving current supplied to the dimming block 200 formed by the plurality of second LEDs 111b.

According to various embodiments, a connection portion SA may be formed between an LED connected to the first driving power source 60a or the first driving device 300a, and an LED connected to the second driving power source 60b or the second driving device 300b.

Comparing FIG. 11 and FIG. 12 to FIG. 13 and FIG. 14, the wirings Wa2 and Wb1, which are treated as dummy wiring in the second light source apparatus 100, are used as a wiring connected to the driving power source 60a or 60b or the driving device 300 in the first light source apparatus 100.

According to the disclosure, by forming the dummy wiring on the substrate 112, the first light source apparatus 100 or the second light source apparatus 100 may be manufactured using a single type of substrate 112.

According to various embodiments, not only the second light source apparatus 100 but also the first light source apparatus 100 may have dummy wiring depending on the number and/or type of driving devices 300 and the number and/or type of driving power source to be disposed on the substrate 112.

Figure 15:
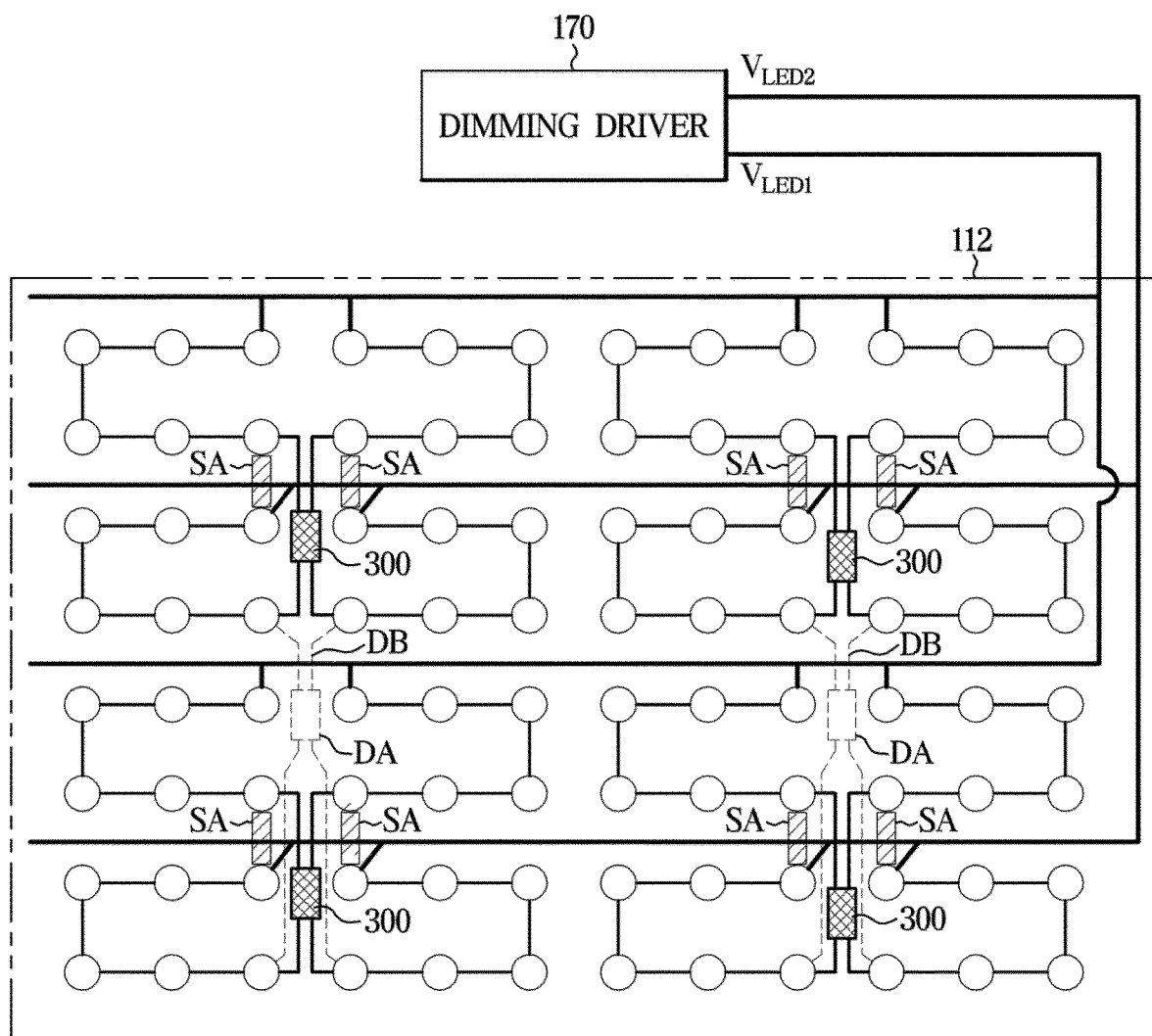
FIG. 15 illustrates an example of connection relationship between a first light source apparatus and a dimming driver of a display apparatus according to an embodiment.
Figure 16:
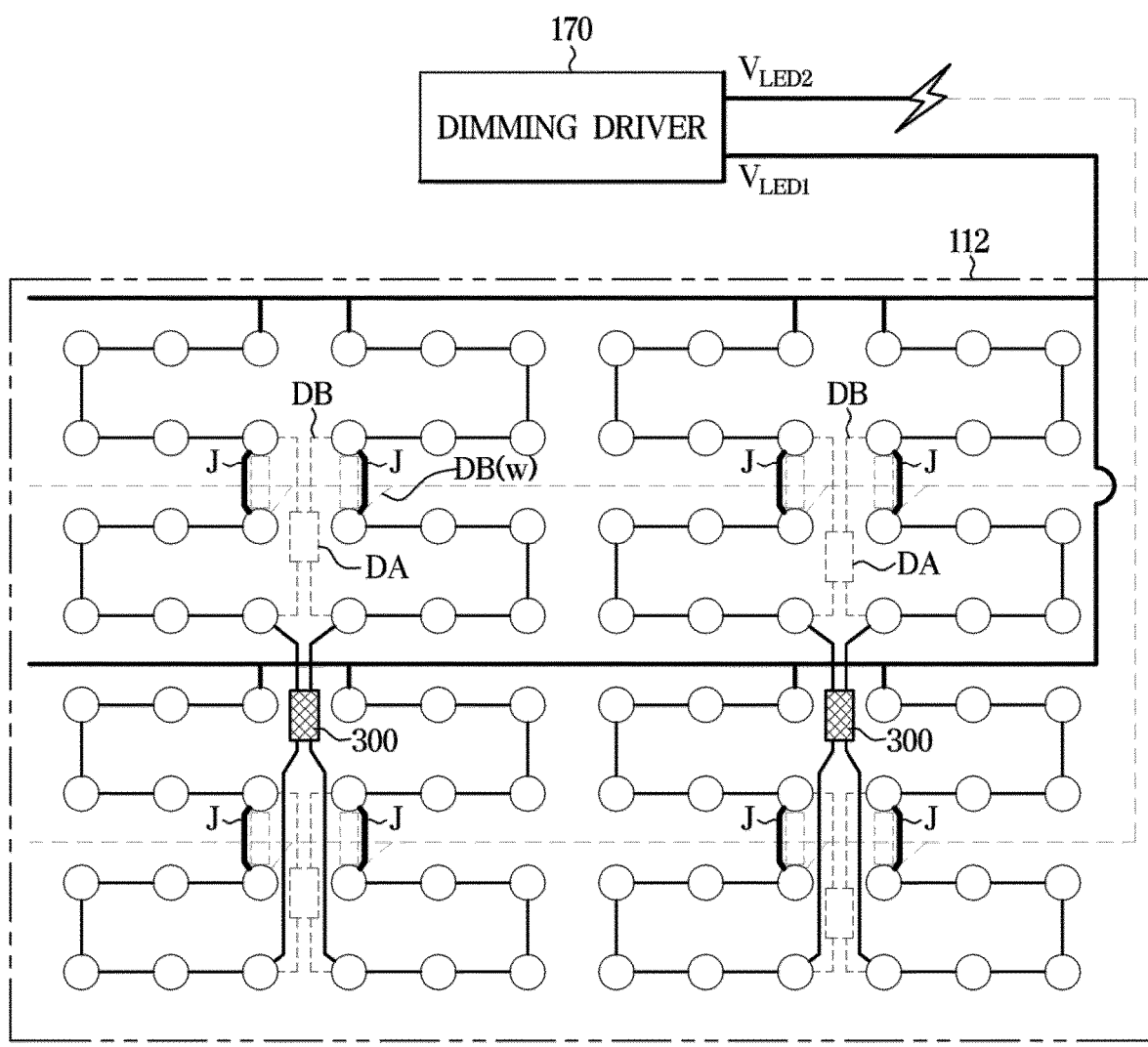
FIG. 16 illustrates an example of connection relationship between a second light source apparatus and a dimming driver of a display apparatus according to an embodiment.

FIG. 15 illustrates an example of connection relationship between a first light source apparatus and a dimming driver of a display apparatus according to an embodiment. FIG. 16 illustrates an example of connection relationship between a second light source apparatus and a dimming driver of a display apparatus according to an embodiment.

A wiring w may be formed on the substrate 112.

For example, a wiring connected to a driving power source, a wiring for connecting the plurality of dimming blocks 200 and the plurality of driving devices 300, a wiring for transmitting a data signal and/or source signal output from the dimming driver 170 to the plurality of driving devices 300 (e.g., data wiring, source wiring, and connection wiring to connect the driving devices 300) may be formed on the substrate 112.

To simplify the drawings, the wiring for transmitting a data signal and/or source signal output from the dimming driver 170 to the plurality of driving devices 300 (e.g., data wiring, source wiring, and connection wiring to connect the driving devices 300) is omitted.

Each of the plurality of driving devices 300 may be mounted at a predetermined position on the substrate 112.

According to various embodiments, each of the plurality of driving devices 300 may be a q-channel driving device that may control q dimming blocks 200 (q is a natural number). For example, as shown in FIG. 15 and FIG. 16, each of the plurality of driving devices 300 may be a 4-channel driving device that may control four dimming blocks 200.

According to various embodiments, in order to unify types of the plurality of driving devices 300, in manufacturing the first light source apparatus 100 and the second light source apparatus 100, the plurality of driving devices 300 having the same channel may be mounted in different positions.

Referring to FIG. 15, the plurality of driving devices 300 mounted on the first light source apparatus 100 may be provided between the plurality of dimming blocks 200. However, the position of the plurality of driving devices 300 is not limited thereto, and any position may be selected as a position of the plurality of driving devices 300, as long as it may be electrically connected to the q number of adjacent dimming blocks 200 by the wiring w formed on the substrate 112.

The driving power source may be connected to any one LED of the LEDs included in each of the plurality of dimming blocks 200 through the wiring w formed on the substrate 112. The driving device 300 may be connected to another LED of the LEDs included in each of the plurality of dimming blocks 200 through the wiring w formed on the substrate 112.

Hereinafter, for convenience of description, among the LEDs included in each of the plurality of dimming blocks 200, the LED connected to the driving power source is defined as a 'start LED', and the LED connected to the driving device 300 is defined as a 'last LED'.

According to various embodiments, a pattern of the wiring w formed on the substrate 112 to connect the dimming blocks 200 in a first column may be symmetrical to a pattern of the wiring w formed on the substrate 112 to connect the dimming blocks 200 in a second column adjacent to the first column.

According to the disclosure, a last LED of the dimming blocks 200 in the first column may be disposed close to a last LED of the dimming blocks 200 in the second column, thereby reducing wiring complexity.

According to various embodiments, in a case where a connection portion SA is formed between the dimming blocks 200 in a first row and the dimming blocks 200 in a second row adjacent to the first row, a connection portion SA may not be formed between the dimming blocks 200 in the second row and the dimming blocks 200 in a third row adjacent to the second row.

That is, the connection relationship described in FIG. 9 to FIG. 14 between the plurality of first LEDs 111a and the plurality of second LEDs 111b may be repeatedly implemented on the substrate 112. For example, assuming that a plurality of third LEDs 111c connected in series are provided below the plurality of second LEDs 111b, solder opening mask may not be formed between the plurality of second LEDs 111b and the plurality of third LEDs 111c.

Hereinafter, for convenience of description, it is assumed that the number of LEDs 111 formed on the substrate 112 is k, the number of LEDs included in a single dimming block 200 of the first light source apparatus 100 is n, the number of dimming blocks 200 of the first light source apparatus 100 is k/n, the number of LEDs included in a single dimming block 200 of the second light source apparatus 100 is 2n, and the number of dimming blocks 200 of the second light source apparatus 100 is k/2n.

Referring back to FIG. 15, the plurality of driving devices 300 may be connected to a last LED of the k/n dimming blocks 200 through the wiring w formed on the substrate 112.

In a case where each of the plurality of driving devices 300 is a q-channel driving device, each of the plurality of driving devices 300 may be connected to q dimming blocks 200, and thus the number of driving devices 300 required may be k/(n*q). For example, in a case where the number of LEDs 111 is 1200, the number of LEDs included in a single dimming block 200 is 6, the number of dimming blocks 200 is 200, and the driving device 300 is a 4-channel driving device, fifty driving devices 300 may be required to control 200 dimming blocks 200.

According to various embodiments, positions of the plurality of first driving devices 300 mounted on the substrate 112 of the first light source apparatus 100 may not overlap positions DA of the plurality of second driving devices 300 mounted on the substrate 112 of the second light source apparatus 100.

The substrate 112 of the first light source apparatus 100 may include a dummy wiring DB extended to the predetermined positions DA where the plurality of second driving devices 300 are mounted. The dummy wiring DB formed on the substrate 112 of the first light source apparatus 100 may correspond to the wiring Wb2 described in FIG. 9 to FIG. 14.

Referring to FIG. 16, in a case where the number of LEDs included in a single dimming block 200 in the first light source apparatus 100 is n, the number of LEDs included in a single dimming block 200 in the second light source apparatus 100 is 2n. That is, the plurality of driving devices 300 in the first light source apparatus 100 are required to be connected to a last LED of each of the k/n dimming blocks 200, while the plurality of driving devices 300 in the second light source apparatus 100 are required to be connected to a last LED of each of the k/2n dimming blocks 200.

The substrate 112 of the second light source apparatus 100 may include a dummy wiring DB extended to predetermined positions DA where the plurality of first driving devices 300 in the first light source apparatus 100 are mounted. The dummy wiring DB formed on the substrate 112 of the second light source apparatus 100 may correspond to the wirings Wa2 and Wb2 described in FIG. 9 to FIG. 14.

According to various embodiments, the substrate 112 of the second light source apparatus 100 may include a dummy wiring extended to a predetermined position DA connected to the second driving power source 60b that applies the second driving voltage $V_{LED2}$. The dummy wiring DB formed on the substrate 112 of the second light source apparatus 100 may correspond to the wiring Wb1 described in FIG. 9 to FIG. 14.

According to the disclosure, by disposing different numbers of driving devices 300 at different positions on the same substrate 112, the first light source apparatus 100 or the second light source apparatus 100 may be manufactured.

According to various embodiments, in order to minimize dummy wiring in the first light source apparatus 100 and/or the second light source apparatus 100, in manufacturing the first light source apparatus 100 and the second light source apparatus 100, the plurality of driving devices 300 having different channels may be mounted at the same position.

Figure 17:
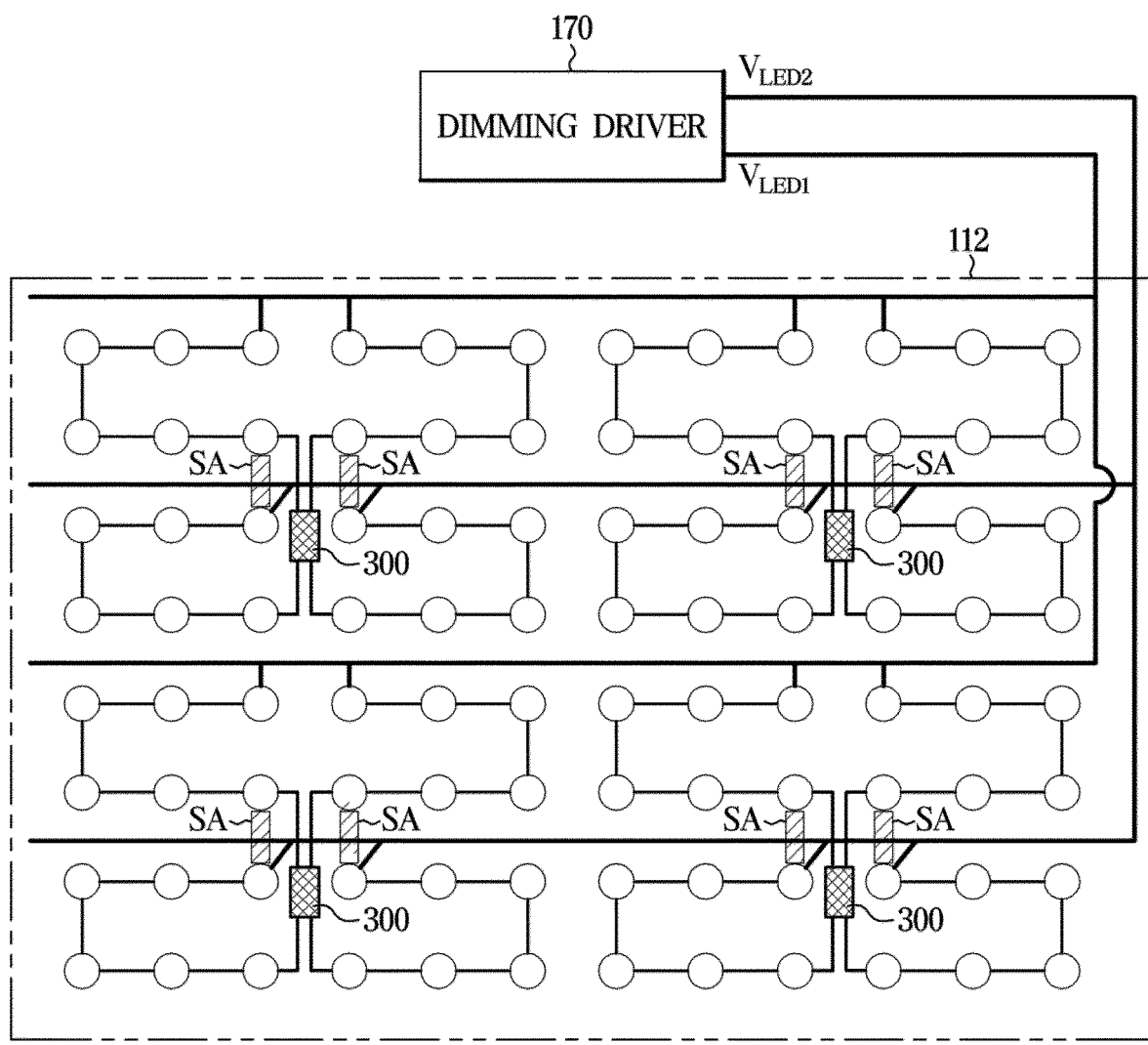
FIG. 17 illustrates an example of connection relationship between a first light source apparatus and a dimming driver of a display apparatus according to an embodiment.
Figure 18:
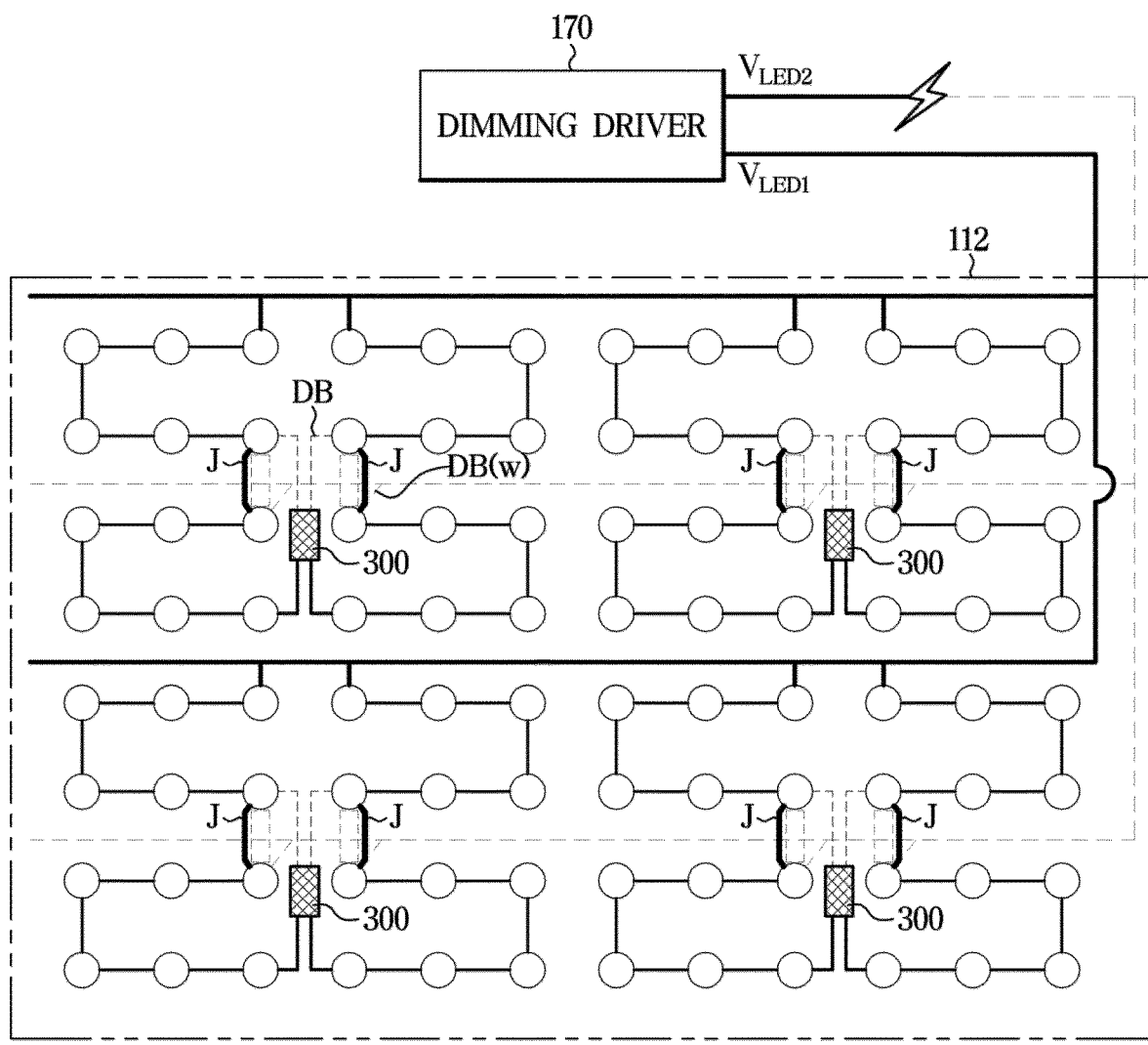
FIG. 18 illustrates an example of connection relationship between a second light source apparatus and a dimming driver of a display apparatus according to an embodiment.

FIG. 17 illustrates an example of connection relationship between a first light source apparatus and a dimming driver of a display apparatus according to an embodiment. FIG. 18 illustrates an example of connection relationship between a second light source apparatus and a dimming driver of a display apparatus according to an embodiment.

Referring to FIG. 17, unlike what is shown in FIG. 15, the substrate 112 of the first light source apparatus 100 may not include a dummy wiring. A start LED of each of the plurality of dimming blocks 200 may be connected to the driving power source (60a, 60b) through the wiring w formed on the substrate 112 and may receive driving voltage ($V_{LED1}$, $V_{LED2}$). A last LED of each of the plurality of dimming blocks 200 may be connected to the plurality of first driving devices 300 through the wiring w formed on the substrate 112. Each of the plurality of first driving devices 300 may include a plurality of nodes that are electrically connectable to all of the wiring connected thereto.

According to various embodiments, the positions where the plurality of first driving devices 300 in FIG. 17 are mounted and the positions where the plurality of second driving devices 300 in FIG. 18 are mounted may be the same. That is, the number of first driving devices 300 and the number of second driving devices 300 may be the same. However, the types of the plurality of first driving devices 300 and the plurality of second driving devices 300 may be different from each other. For example, the number of channels of the plurality of second driving devices 300 may be less than the number of channels of the plurality of first driving devices 300. For example, the number of channels of the plurality of second driving devices 300 may be half of the number of channels of the plurality of first driving devices 300.

Referring to FIG. 18, similarly to the embodiment of FIG. 16, the substrate 112 of the second light source apparatus 100 may include a dummy wiring DB extended to a predetermined position connected to the second driving power source that applies the second driving voltage $V_{LED2}$. The dummy wiring DB formed on the substrate 112 of the second light source apparatus 100 may correspond to the wiring Wb1 described in FIG. 9 to FIG. 14.

However, unlike the embodiment of FIG. 16, according to the embodiment of FIG. 18, the plurality of second driving devices 300 may be mounted at the positions where the plurality of first driving devices 300 of FIG. 17 are disposed.

The plurality of second driving devices 300 may be connected to a larger number of LEDs than the number of channels through the wiring w. For example, the plurality of second driving devices 300 may be connected to the wirings Wa2 and Wb2 described in FIG. 9 to FIG. 14. However, the plurality of second driving devices 300 may include only the node electrically connectable to the wiring Wb2 connected to the last LED of the plurality of second LEDs 111b from among the wirings Wa2 and Wb2 described in FIG. 9 to FIG. 14. That is, the plurality of second driving devices 300 may not include a node connectable to the wiring Wa2 connected to the last LED of the plurality of first LEDs 111a from among the wirings Wa2 and Wb2 described in FIG. 9 to FIG. 14.

Accordingly, among the wirings Wa2 and Wb2 described in FIG. 9 to FIG. 14, the wiring Wa2 connected to the last LED of the plurality of first LEDs 111a may be treated as a dummy wiring DB.

According to the embodiment of FIG. 17 and FIG. 18, only one of the wirings Wa2 and Wb2 described in FIG. 9 to FIG. 14 may be treated as a dummy wiring DB, thereby reducing circuit complexity of the substrate 112.

According to various embodiments, in order to minimize circuit complexity in the first light source apparatus 100 and/or the second light source apparatus 100, a relatively large number of driving devices 300 may be mounted in manufacturing the first light source apparatus 100 and the second light source apparatus 100.

Figure 19:
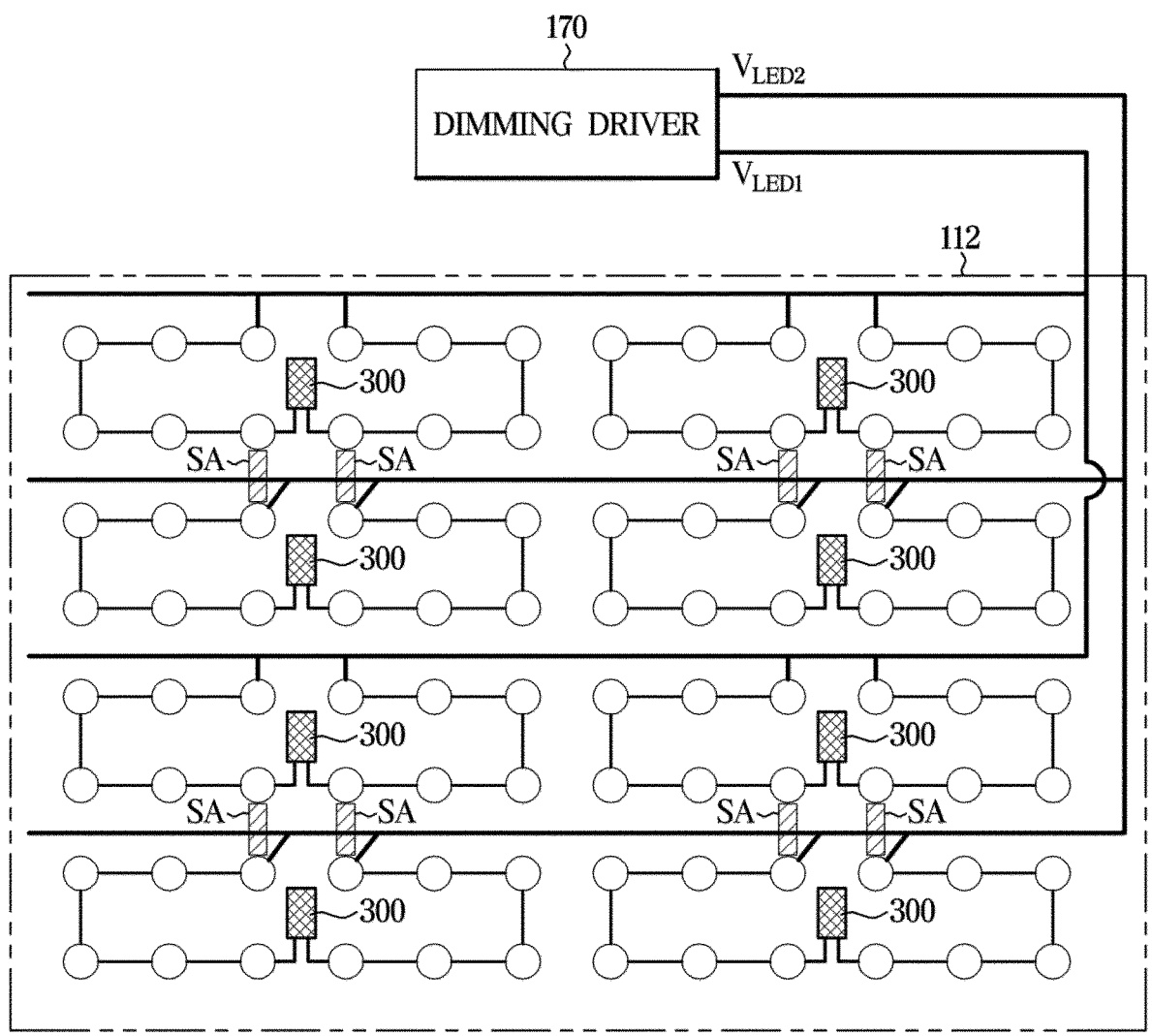
FIG. 19 illustrates an example of connection relationship between a first light source apparatus and a dimming driver of a display apparatus according to an embodiment.
Figure 20:
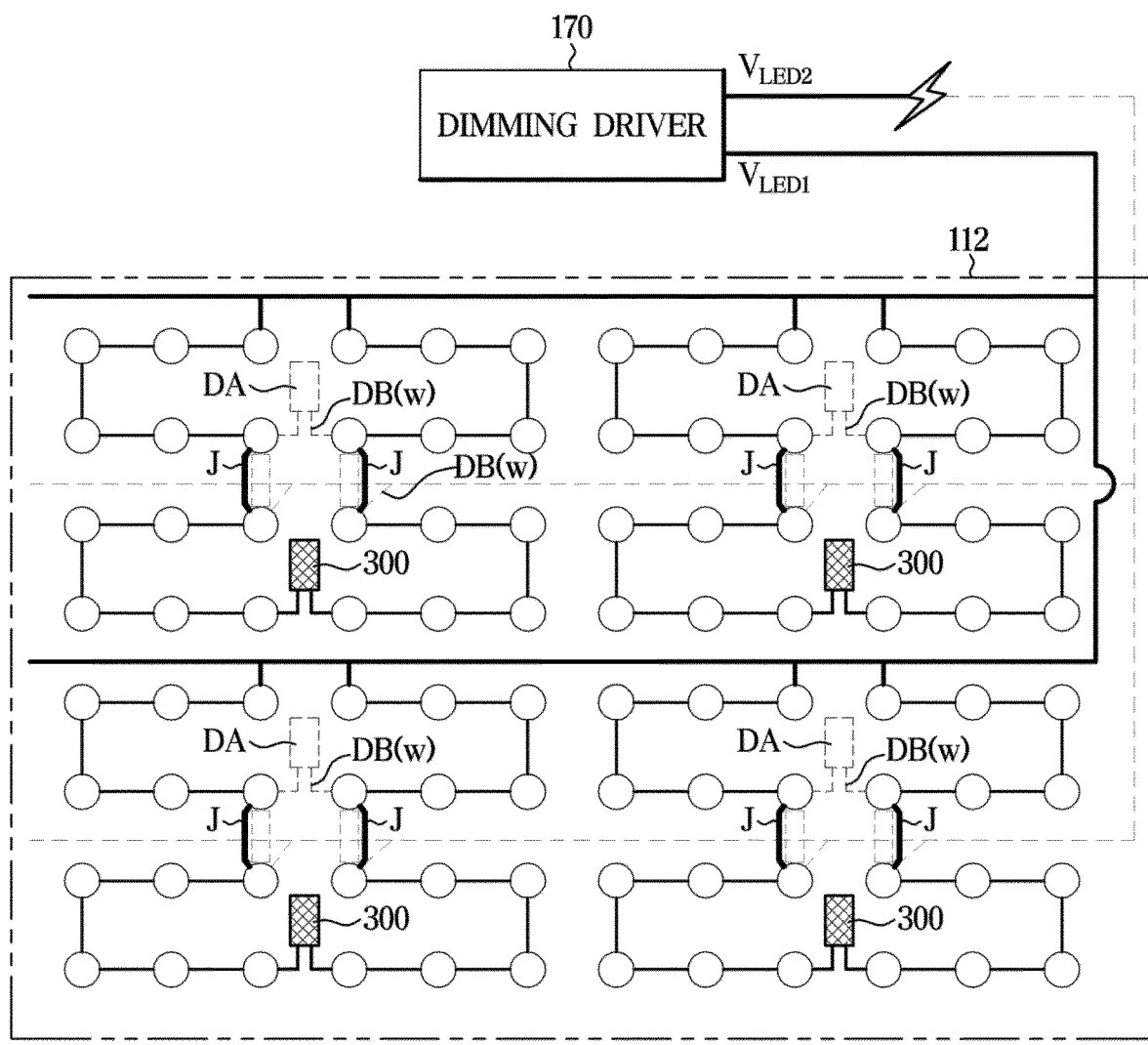
FIG. 20 illustrates an example of connection relationship between a second light source apparatus and a dimming driver of a display apparatus according to an embodiment.

FIG. 19 illustrates an example of connection relationship between a first light source apparatus and a dimming driver of a display apparatus according to an embodiment. FIG. 20 illustrates an example of connection relationship between a second light source apparatus and a dimming driver of a display apparatus according to an embodiment.

Referring to FIG. 19, the substrate 112 of the first light source apparatus 100 may include the plurality of first driving devices 300 for controlling a driving current applied to the dimming blocks 200 arranged in one row and adjacent columns.

The plurality of first driving devices 300 may be connected to the wirings Wa2 and Wb2 described in FIG. 9 to FIG. 14.

Referring to FIG. 20, similarly to the embodiment of FIG. 16, the substrate 112 of the second light source apparatus 100 may include a dummy wiring DB extended to a predetermined position DA connected to the second driving power source 60b that applies the second driving voltage $V_{LED2}$. The dummy wiring DB formed on the substrate 112 of the second light source apparatus 100 may correspond to the wiring Wb1 described in FIG. 9 to FIG. 14.

The substrate 112 of the second light source apparatus 100 may include the plurality of second driving devices 300 for controlling a driving current applied to the dimming blocks 200 arranged in one row and adjacent columns.

The number of dimming blocks 200 in the first light source apparatus 100 is k/n, which is two times as many as the number of k/2n dimming blocks 200 in the second light source apparatus 100. Accordingly, the number of rows of the matrix formed by the dimming blocks 200 in the first light source apparatus 100 may be two times as many as the number of rows of the matrix formed by the dimming blocks 200 in the second light source apparatus 100. The number of first driving devices 300 may be two times as many as the number of second driving devices 300. However, unlike the embodiment of FIG. 16, positions of the plurality of second driving devices 300 mounted on the substrate 112 of the second light source apparatus 100 may overlap positions of the plurality of first driving devices 300 mounted on the substrate 112 of the first light source apparatus 100.

According to an embodiment, the substrate 112 of the second light source apparatus 100 may include a dummy wiring DB extended to a predetermined position DA where half of the plurality of first driving devices 300 are mounted. The dummy wiring DB formed on the substrate 112 of the second light source apparatus 100 may correspond to the wiring Wa2 described in FIG. 9 to FIG. 14.

According to the disclosure, because the dummy wiring DB corresponding to the wiring Wa2 described in FIG. 9 to FIG. 14 does not overlap another wiring, circuit complexity may be reduced.

In addition, according to the disclosure, the second light source apparatus 100 may be manufactured by removing only the driving devices 300 alternately arranged in the column direction among the plurality of first driving devices 300 from the first light source apparatus 100.

According to various embodiments, in manufacturing the first light source apparatus 100 and the second light source apparatus 100, by alternately connecting the driving devices 300 with the dimming blocks 200 arranged in the column direction, a relatively small number of driving devices 300 may be mounted, and the complexity of the mounting positions of the driving devices 300 may be minimized.

Figure 21:
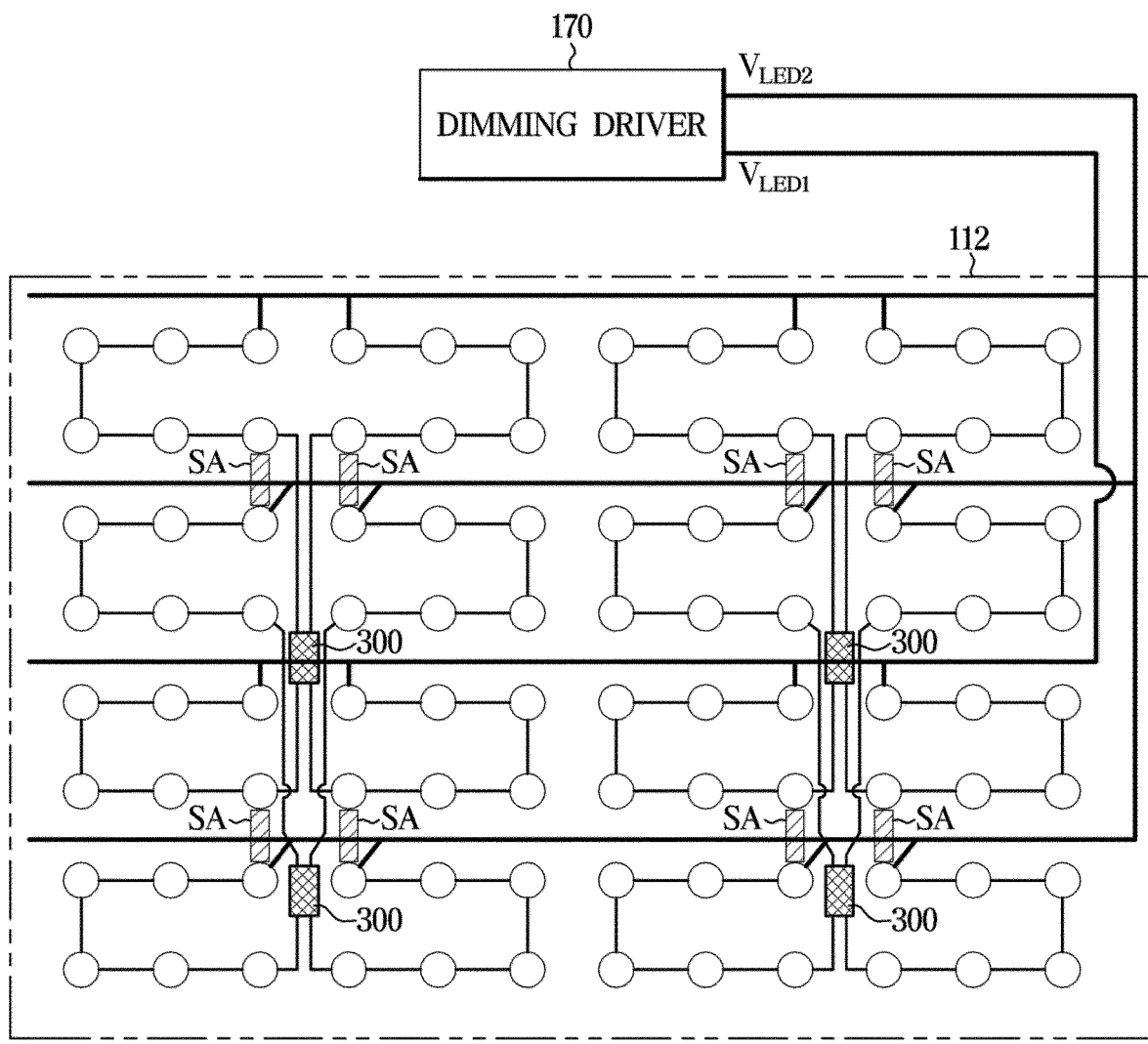
FIG. 21 illustrates an example of connection relationship between a first light source apparatus and a dimming driver of a display apparatus according to an embodiment.
Figure 22:
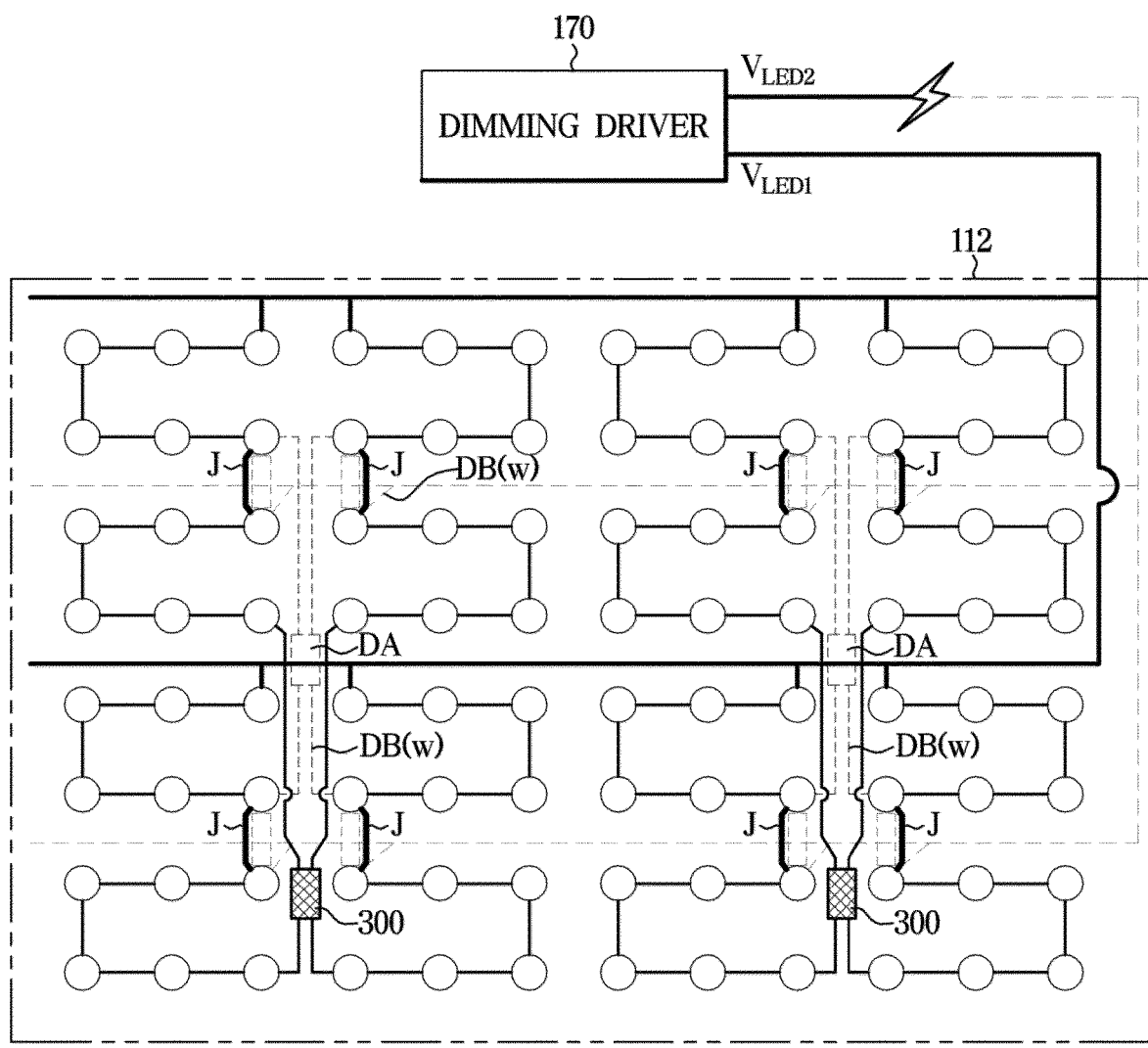
FIG. 22 illustrates an example of connection relationship between a second light source apparatus and a dimming driver of a display apparatus according to an embodiment.

FIG. 21 illustrates an example of connection relationship between a first light source apparatus and a dimming driver of a display apparatus according to an embodiment. FIG. 22 illustrates an example of connection relationship between a second light source apparatus and a dimming driver of a display apparatus according to an embodiment.

Referring to FIG. 21, each of the plurality of first driving devices 300 may control a driving current supplied to the dimming blocks 200 arranged in rows that are not adjacent to each other.

For example, any one 300a of the plurality of first driving devices 300 may be connected to the dimming block 200 arranged in a first row, may not be connected to the dimming block 200 arranged in a second row adjacent to the first row, and may be connected to the dimming block 200 arranged in a third row adjacent to the second row. Another one 300b of the plurality of first driving devices 300 may be connected to the dimming block 200 arranged in the second row, may not be connected to the dimming block 200 arranged in the third row adjacent to the second row, and may be connected to the dimming block 200 arranged in a fourth row adjacent to the third row.

As such, each of the plurality of first driving devices 300 may be alternately connected to the plurality of dimming blocks 200 in the column direction.

Referring to FIG. 22, similarly to the embodiment of FIG. 16, the substrate 112 of the second light source apparatus 100 may include a dummy wiring DB extended to a predetermined position connected to the second driving power source that applies the second driving voltage $V_{LED2}$. The dummy wiring DB formed on the substrate 112 of the second light source apparatus 100 may correspond to the wiring Wb1 described in FIG. 9 to FIG. 14.

The substrate 112 of the second light source apparatus 100 may include the plurality of second driving devices 300 for controlling a driving current applied to the dimming blocks 200 arranged in one row and adjacent columns. The plurality of second driving devices 300 may correspond to the driving device 300b connected to the dimming blocks 200 arranged in second and fourth rows in FIG. 21.

In the example shown in FIG. 21, the substrate 112 of the second light source apparatus 100 may include a dummy wiring DB extended to a predetermined position DA where the driving device 300a may be mounted. The dummy wiring DB formed on the substrate 112 of the second light source apparatus 100 may correspond to the wiring Wa2 described in FIG. 9 to FIG. 14.

According to the disclosure, the first light source apparatus 100 or the second light source apparatus 100 may be manufactured by mounting all the driving devices 300 at predetermined positions or only at some positions on the substrate 112.

The arrangement of the plurality of driving devices 300 and the arrangement of the dummy wiring DB are not limited to the examples shown in FIG. 15 to FIG. 22, and any arrangement may be used as long as it satisfies the connection relationships described in FIG. 9 to FIG. 14.

According to various embodiments, as shown in FIG. 15 to FIG. 22, positions of the driving devices 300, mounted in an area (hereinafter referred to as 'first area') between the first column and the second column adjacent to the first column where the dimming blocks 200 are arranged, may be different from positions of the driving devices 300 mounted in an area (hereinafter referred to as 'second area') between the third column adjacent to the second column and the fourth column adjacent to the third column.

For example, a portion of the driving devices 300 in the second area may be mounted lower than the driving devices 300 in the first area. For example, among the driving devices 300 arranged in the first area, a virtual line connecting the driving device 300 connected to the dimming block 200 arranged in the first row in the row direction may not pass through the driving device 300 connected to the dimming block 200 arranged in the first row among the driving devices 300 arranged in the second area.

According to the disclosure, optical defects caused by the plurality of driving devices 300 may be prevented or suppressed by mounting the driving devices 300 arranged in different areas at different positions in the corresponding area.

In addition, according to the disclosure, ease of design of connection wiring that connects the plurality of dimming blocks 200 may be ensured.

The method for manufacturing the light source apparatus 100 including n dimming blocks 200 each including k/n LEDs or the light source apparatus 100 including 2n dimming blocks 200 each including k/2n LEDs by using a single substrate 112 including k LEDs has been described above.

Embodiments of the disclosure are not limited thereto, and may be expanded to a method for manufacturing the light source apparatus 100 including n dimming blocks 200 each including k/n LEDs or the light source apparatus 100 including m dimming blocks 200 each including k/m LEDs. For example, k/n may be 6, and k/m may be 9.

Figure 23:
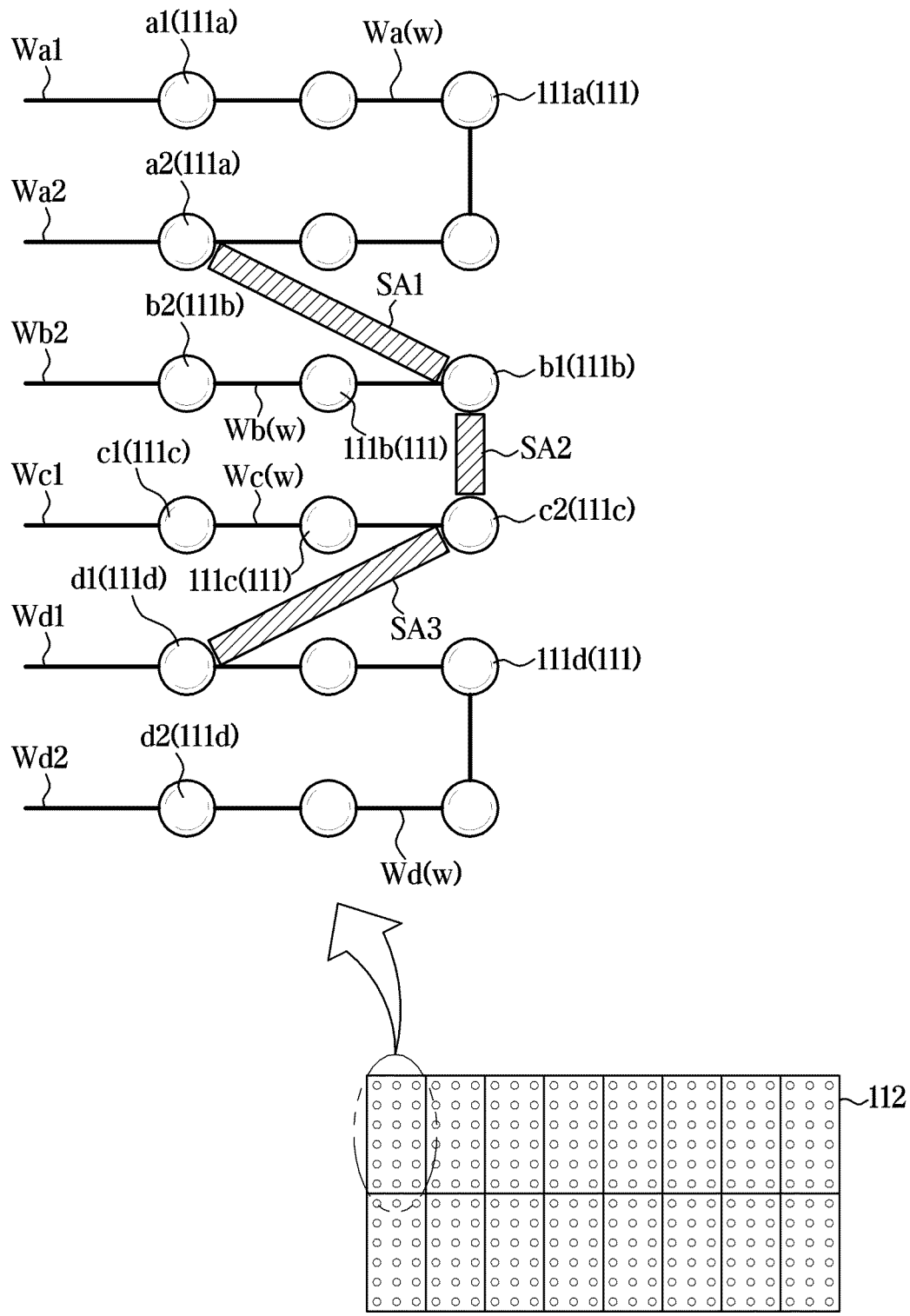
FIG. 23 illustrates an example of a substrate for a light source apparatus according to an embodiment.

FIG. 23 illustrates an example of a substrate for a light source apparatus according to an embodiment.

Referring to FIG. 23, the plurality of LEDs 111 may include the plurality of first LEDs 111a connected in series to each other by the wiring Wa formed on the substrate 112, the plurality of second LEDs 111b connected in series to each other by the wiring Wb formed on the substrate 112, the plurality of third LEDs 111c connected in series to each other by a wiring Wc formed on the substrate 112, and a plurality of fourth LEDs 111d connected in series to each other by a wiring Wd formed on the substrate 112.

The plurality of first LEDs 111a may belong to a first group, the plurality of second LEDs 111b may belong to a second group, the plurality of third LEDs 111c may belong to a third group, and the plurality of fourth LEDs 111d may belong to a fourth group.

As shown in FIG. 23, the first to fourth groups may be adjacent to each other in the column direction, but the positional relationship of the first to fourth groups is not limited thereto. For example, the first to fourth groups may be adjacent to each other in the row direction.

The plurality of first LEDs 111a may be connected in series to each other by the wiring w (e.g., the first dimming wiring Wa) formed on the substrate 112. The plurality of second LEDs 111b may be connected in series to each other by the wiring w (e.g., the second dimming wiring Wb) formed on the substrate 112. The plurality of third LEDs 111c may be connected in series to each other by the wiring w (e.g., the third dimming wiring Wc) formed on the substrate 112. The plurality of fourth LEDs 111d may be connected in series to each other by the wiring w (e.g., the fourth dimming wiring Wd) formed on the substrate 112.

According to various embodiments, the number of first LEDs 111a and the number of second LEDs 111b may be different from each other. For example, the number of first LEDs 111a may be two times as many as the number of second LEDs 111b. According to various embodiments, the number of first LEDs 111a and the number of third LEDs 111c may be different from each other. For example, the number of first LEDs 111a may be two times as many as the number of third LEDs 111c. According to various embodiments, the number of first LEDs 111a and the number of fourth LEDs 111d may be the same.

Any one LED a1 of the plurality of first LEDs 111a may be connected to a wiring Wa1 extended to a predetermined position. According to various embodiments, the predetermined position may be a position where the driving device 300 may be mounted or a position connectable to a driving power source.

Another LED a2 of the plurality of first LEDs 111a may be connected to a wiring Wa2 extended to a predetermined position. According to various embodiments, the predetermined position may be a position connectable to a driving power source or a position where the driving device 300 may be mounted.

Any one LED b2 of the plurality of second LEDs 111b may be connected to a wiring Wb2 extended to a predetermined position. According to various embodiments, the predetermined position may be a position where the driving device 300 may be mounted or a position connectable to a driving power source.

Any one LED c1 of the plurality of third LEDs 111c may be connected to a wiring Wc1 extended to a predetermined position. According to various embodiments, the predetermined position may be a position where the driving device 300 may be mounted or a position connectable to a driving power source.

Any one LED d1 of the plurality of fourth LEDs 111d may be connected to a wiring Wd1 extended to a predetermined position. According to various embodiments, the predetermined position may be a position where the driving device 300 may be mounted or a position connectable to a driving power source.

Another LED d2 of the plurality of fourth LEDs 111d may be connected to a wiring Wd2 extended to a predetermined position. According to various embodiments, the predetermined position may be a position connectable to a driving power source or a position where the driving device 300 may be mounted.

A connection portion SA1 may be formed between the first group and the second group. A connection portion SA2 may be formed between the second group and the third group. A connection portion SA3 may be formed between the third group and the fourth group. A connection portion SA may not be formed between the third group and the fourth group.

The first connection portion SA1 may be formed between the any one LED a2 of the plurality of first LEDs 111a and any one LED b1 of the plurality of second LEDs 111b. According to various embodiments, the first connection portion SA1 may be formed between the LED a2 disposed at the lowermost and leftmost (or rightmost) among the plurality of first LEDs 111a and the LED b1 disposed at the rightmost (or leftmost) among the plurality of second LEDs 111b.

The second connection portion SA2 may be formed between the any one LED b1 of the plurality of second LEDs 111b and any one LED c2 of the plurality of third LEDs 111c. According to various embodiments, the second connection portion SA2 may be formed between the LED b1 disposed at the rightmost (or leftmost) among the plurality of second LEDs 111b and the LED c2 disposed at the rightmost (or leftmost) among the plurality of third LEDs 111c.

The third connection portion SA3 may be formed between the any one LED c2 of the plurality of third LEDs 111c and the any one LED d1 of the plurality of fourth LEDs 111d. According to various embodiments, the third connection portion SA3 may be formed between the LED c2 disposed at the rightmost (or leftmost) among the plurality of third LEDs 111c and the LED d1 disposed at the uppermost and leftmost (or rightmost) among the plurality of fourth LEDs 111d.

According to various embodiments, the arrangement of the wirings (Wa, Wb, Wc, Wd) connecting the plurality of LEDs 111 and the arrangement of the connection portions (SA1, SA2, SA3) may be changed.

Among the plurality of first LEDs 111a, any one LED a1 may be connected to the wiring Wa1 extended to a predetermined position, and another LED a2 may be connected to the wiring Wa2 extended to a predetermined position.

The wiring Wa1 connected to the one LED a1 of the plurality of first LEDs 111a may be extended to a position connectable to the first driving power source 60a that applies the first driving voltage $V_{LED1}$.

The wiring Wa2 connected to the other LED a2 of the plurality of first LEDs 111a may be extended to a predetermined position where the driving device 300 may be mounted.

The any one LED b2 of the plurality of second LEDs 111b may be connected to the wiring Wb2 extended to a predetermined position. The wiring Wb2 extended to the predetermined position may be extended to a predetermined position where the driving device 300 may be mounted.

The any one LED c1 of the plurality of third LEDs 111c may be connected to the wiring Wc1 extended to a predetermined position. The wiring Wc1 extended to the predetermined position may be extended to a position connectable to the second driving power source 60b that applies the second driving voltage $V_{LED2}$.

Among the plurality of fourth LEDs 111d, any one LED d1 may be connected to the wiring Wd1 extended to a predetermined position, and another LED d2 may be connected to the wiring Wd2 extended to a predetermined position.

The wiring Wd1 connected to the one LED d1 of the plurality of fourth LEDs 111d may be extended to a position connectable to the first driving power source 60a that applies the first driving voltage $V_{LED1}$.

The wiring Wd2 connected to the other LED d2 of the plurality of fourth LEDs 111d may be extended to a predetermined position where the driving device 300 may be mounted.

In a subsequent manufacturing process of the light source apparatus 100, jumper components J may be selectively mounted on the connection portions SA1, SA2, and SA3.

Figure 24:
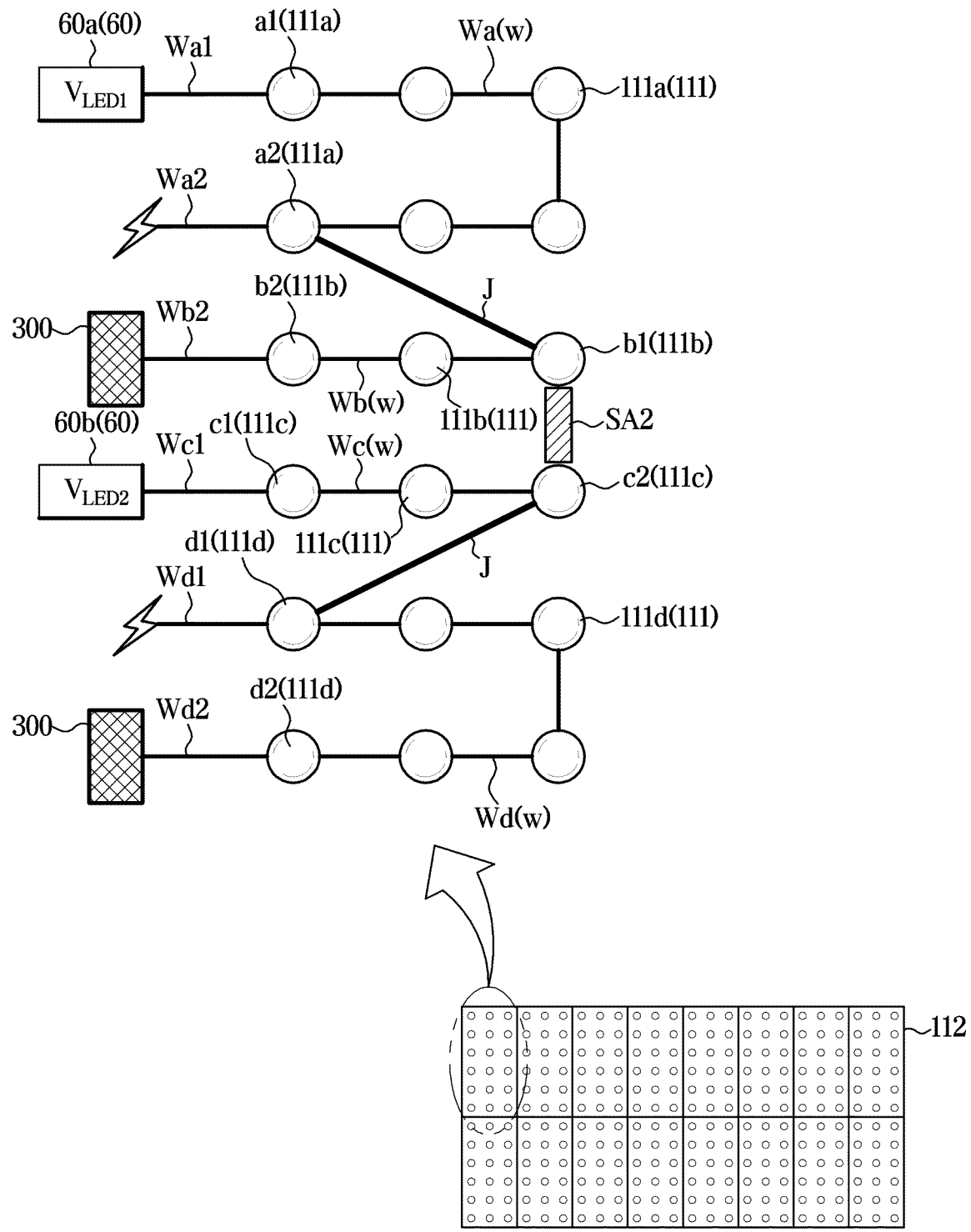
FIG. 24 illustrates an example where the substrate for the light source apparatus shown in FIG. 23 is used as a second light source apparatus.

FIG. 24 illustrates an example where the substrate for the light source apparatus shown in FIG. 23 is used as a second light source apparatus.

Referring to FIG. 24, a process of manufacturing the second light source apparatus 100 may include mounting a jumper component J on each of the first connection portion SA and the third connection portion SA.

The process of manufacturing the second light source apparatus 100 may include mounting the plurality of driving devices 300 at predetermined positions to which the wirings Wb1 and Wd2 extend.

The substrate 112 may include the jumper components J mounted on the first connection portion SA and the third connection portion SA.

The substrate 112 may include the driving devices 300 connected to the wirings Wb1 and Wd2.

As any one LED a2 of the plurality of first LEDs 111a and any one LED b1 of the plurality of second LEDs 111b are connected by the jumper component J, the wiring Wa2 connected to the any one LED a2 may be treated as a dummy wiring. Because the dummy wiring Wa2 is not connected to any component, the wiring Wa2 may be treated as an open circuit.

On the other hand, because a jumper component J is not mounted on the second connection portion SA2 formed between the plurality of second LEDs 111b and the plurality of third LEDs 111c, the plurality of second LEDs 111b and the plurality of third LEDs 111c may be electrically blocked from each other.

As the any one LED a2 of the plurality of first LEDs 111a and the any one LED b1 of the plurality of second LEDs 111b are connected by the jumper component J, the plurality of first LEDs 111a and the plurality of second LEDs 111b may be connected in series. Accordingly, the plurality of first LEDs 111a and the plurality of second LEDs 111b may operate as a single dimming block 200.

Any one LED a1 of the plurality of first LEDs 111a may be connected to the first driving power source 60a by the wiring Wa1 formed on the substrate 112, and any one LED b2 of the plurality of second LEDs 111b may be connected to the driving device 300 by the wiring Wb2 formed on the substrate 112.

The first driving power source 60a may apply a driving voltage $V_{LED1}$ to the dimming block 200 including the plurality of first LEDs 111a and the plurality of second LEDs 111b.

The driving device 300 may control a current flowing through the dimming block 200 including the plurality of first LEDs 111a and the plurality of second LEDs 111b.

As any one LED c2 of the plurality of third LEDs 111c and any one LED d1 of the plurality of fourth LEDs 111d are connected by a jumper component J, the wiring Wd1 connected to the any one LED d1 of the plurality of fourth LEDs 111d may be treated as a dummy wiring. Because the dummy wiring Wd1 is not connected to any component, the wiring Wd1 may be treated as an open circuit.

As the any one LED c2 of the plurality of third LEDs 111c and the any one LED d1 of the plurality of fourth LEDs 111d are connected by the jumper component J, the plurality of third LEDs 111c and the plurality of fourth LEDs 111d may be connected in series. Accordingly, the plurality of third LEDs 111c and the plurality of fourth LEDs 111d may operate as a single dimming block 200.

Any one LED c1 of the plurality of third LEDs 111c may be connected to the second driving power source 60b by the wiring Wc1 formed on the substrate 112, and any one LED d2 of the plurality of fourth LEDs 111d may be connected to the driving device 300 by the wiring Wd2 formed on the substrate 112.

The second driving power source 60b may apply a driving voltage $V_{LED2}$ to the dimming block 200 including the plurality of third LEDs 111c and the plurality of fourth LEDs 111d. According to various embodiments, the first driving power source 60a and the second driving power source 60b may be the same power source.

The driving device 300 may control a current flowing through the dimming block 200 including the plurality of third LEDs 111c and the plurality of fourth LEDs 111d. According to various embodiments, the driving device 300 connected to the dimming block 200 including the plurality of first LEDs 111a and the plurality of second LEDs 111b, and the driving device 300 connected to the dimming block 200 including the plurality of third LEDs 111c and the plurality of fourth LEDs 111d may be the same driving device 300 or may be different from each other.

Figure 25:
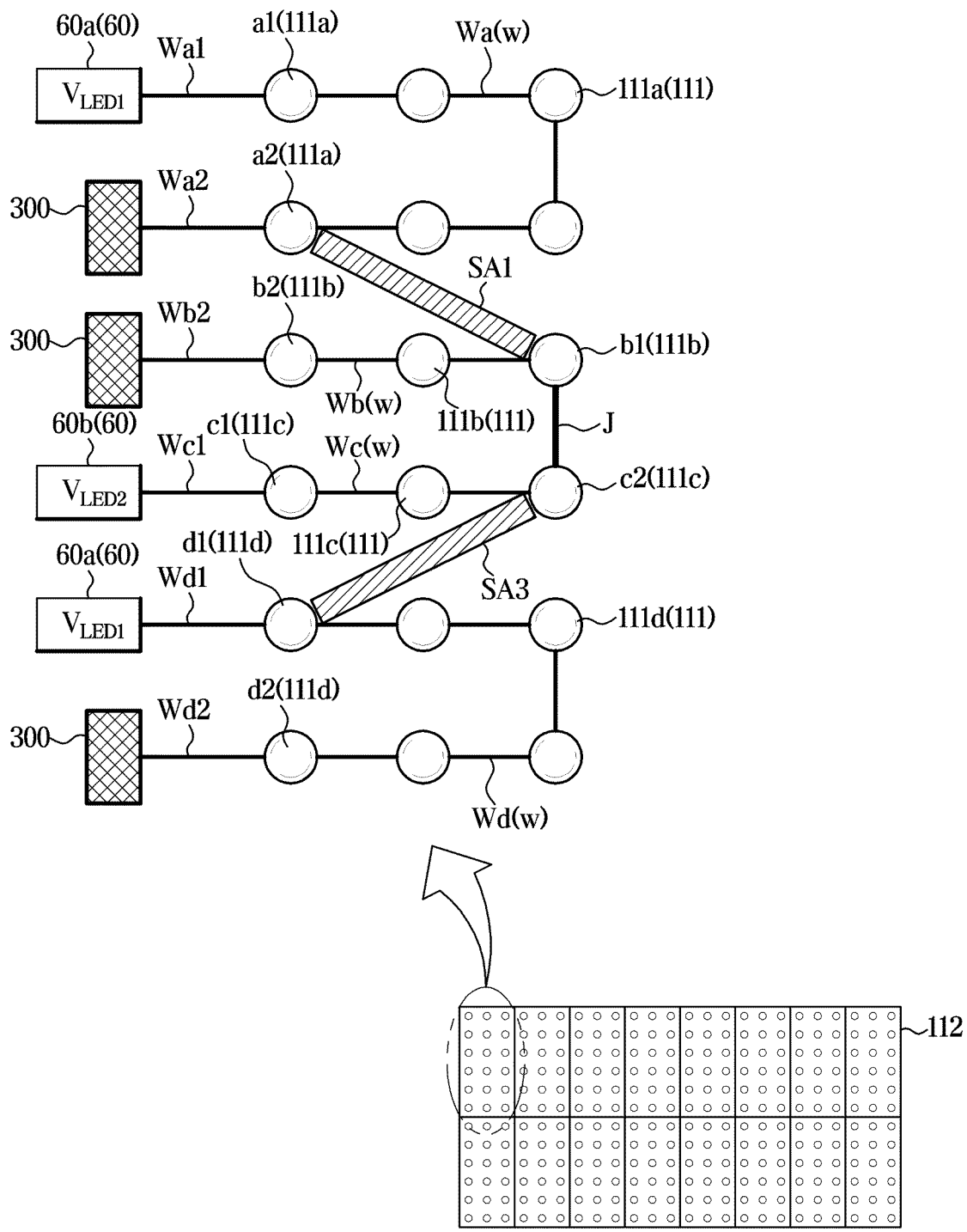
FIG. 25 illustrates an example where the substrate for the light source apparatus shown in FIG. 23 is used as a first light source apparatus.

FIG. 25 illustrates an example where the substrate for the light source apparatus shown in FIG. 23 is used as a first light source apparatus.

Referring to FIG. 25, a process of manufacturing the first light source apparatus 100 may include mounting a jumper component J on the second connection portion SA.

The process of manufacturing the first light source apparatus 100 may include mounting the plurality of driving devices 300 at predetermined positions to which the wirings Wa2, Wb1, and Wd2 extend.

The substrate 112 may include the jumper component J mounted on the second connection portion SA.

The substrate 112 may include the driving devices 300 connected to wirings Wa2, Wb1, and Wd2.

As any one LED b1 of the plurality of second LEDs 111b and any one LED c2 of the plurality of third LEDs 111c are connected by the jumper component J, the plurality of second LEDs 111b and the plurality of third LEDs 111c may be connected to each other in series. Accordingly, the plurality of second LEDs 111b and the plurality of third LEDs 111c may operate as a single dimming block 200.

On the other hand, no jumper component J is mounted on the first connection portion SA1 formed between the plurality of first LEDs 111a and the plurality of second LEDs 111b, and the third connection portion SA3 formed between the plurality of third LEDs 111c and the plurality of fourth LEDs 111d, and thus the plurality of first LEDs 111a and the plurality of second LEDs 111b may be electrically blocked from each other, and the plurality of third LEDs 111c and the plurality of fourth LEDs 111d may be electrically blocked from each other.

Any one LED a1 of the plurality of first LEDs 111a may be connected to the first driving power source 60a by the wiring Wa1 formed on the substrate 112, and another LED a2 of the plurality of first LEDs 111a may be connected to the driving device 300 by the wiring Wa2 formed on the substrate 112.

The first driving power source 60a may apply a driving voltage $V_{LED1}$ to the dimming block 200 including the plurality of first LEDs 111a.

The driving device 300 may control a current flowing through the dimming block 200 including the plurality of first LEDs 111a.

Any one LED b2 of the plurality of second LEDs 111b may be connected to the driving device 300 by the wiring Wb2 formed on the substrate 112.

Any one LED c1 of the plurality of third LEDs 111c may be connected to the second driving power source 60b by the wiring Wc1 formed on the substrate 112.

The second driving power source 60b may apply a driving voltage $V_{LED2}$ to the dimming block 200 including the plurality of second LEDs 111b and the plurality of third LEDs 111c.

The driving device 300 may control a current flowing through the dimming block 200 including the plurality of second LEDs 111b and the plurality of third LEDs 111c.

Any one LED d1 of the plurality of fourth LEDs 111d may be connected to the first driving power source 60a by the wiring Wd1 formed on the substrate 112, and another LED d2 of the plurality of fourth LEDs 111d may be connected to the driving device 300 by the wiring Wd2 formed on the substrate 112.

The first driving power source 60a may apply a driving voltage $V_{LED1}$ to the dimming block 200 including the plurality of fourth LEDs 111d.

The driving device 300 may control a current flowing through the dimming block 200 including the plurality of fourth LEDs 111d.

According to the disclosure, by using a single substrate 112 including k LEDs, the light source apparatus 100 including n dimming blocks 200 each including k/n LEDs (e.g., 6) or the light source apparatus 100 including m dimming blocks 200 each including k/m LEDs (e.g., 9) may be manufactured.

According to the disclosure, a connection portion SA may be formed between a plurality of groups, each of which includes the plurality of LEDs 111 connected in series, and thus various types of light source apparatuses 100 including the dimming block 200 having different numbers of LEDs may be manufactured by using one substrate 112.

According to the disclosure, by forming a dummy wiring on the substrate 112, various types of light source apparatuses 100 including the dimming block 200 having different numbers of LEDs may be manufactured by using one substrate 112.

Embodiments of the disclosure are not limited to the above-described embodiments, and may be expanded to all embodiments for manufacturing the substrate 112 on which a connection portion SA is formed between a plurality of groups, each of which includes a plurality of LEDs 111 connected in series, and manufacturing the light source apparatus 100 having different numbers of dimming blocks 200 using the substrate 112.

Figure 26:
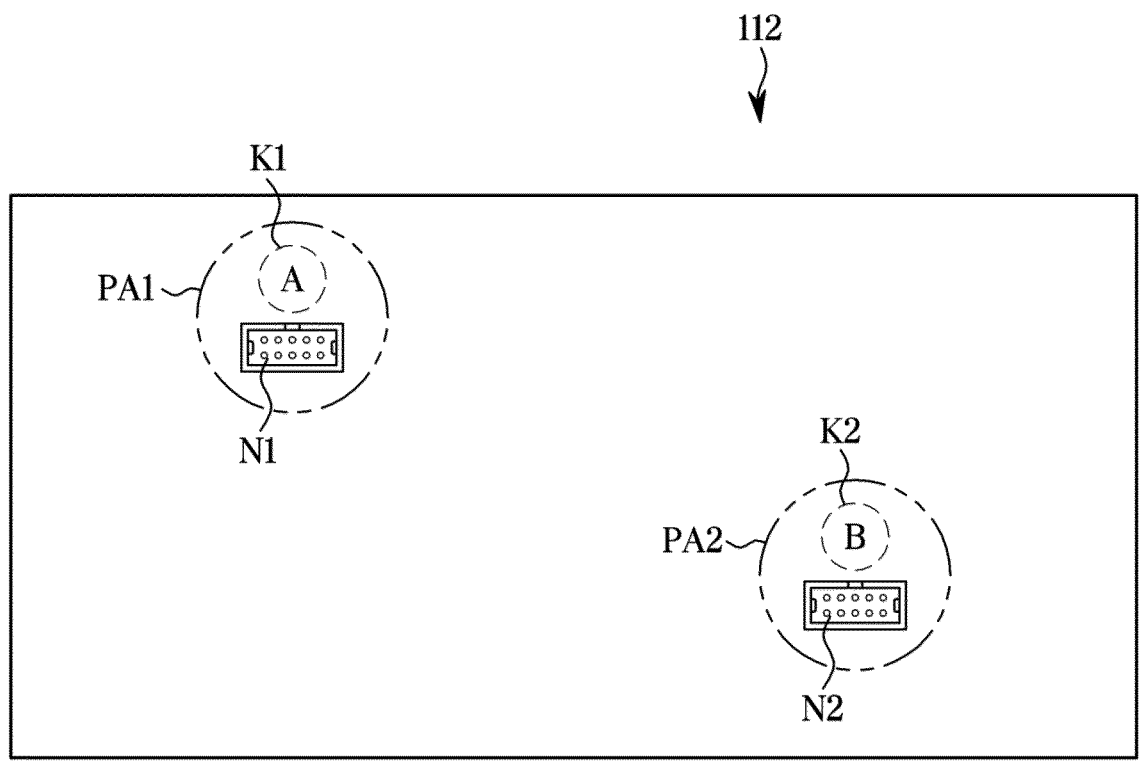
FIG. 26 illustrates a side of a substrate for a light source apparatus according to an embodiment.

FIG. 26 illustrates a side of a substrate for a light source apparatus according to an embodiment.

Referring to FIG. 26, the substrate 112 may include a first side on which the plurality of LEDs 111 are mounted, and a second side opposite to the first side.

A plurality of mounting portions (mounts) PA1 and PA2 to which the control assembly 50 and the power supply assembly 60 of the display apparatus 10 may be connected may be provided on the second side of the substrate 112.

The first mounting portion PA1 may be a mounting portion for the first light source apparatus.

The second mounting portion PA2 may be a mounting portion for the second light source apparatus.

The first mounting portion PA1 may include a first connector N1 connectable to a connector of the dimming driver 170. In an embodiment, in a case where the connector of the dimming driver 170 is a male connector, the first connector N1 may be a female connector. In a case where the connector of the dimming driver 170 is a female connector, the first connector N1 may be a male connector.

According to various embodiments, the first mounting portion PA1 may further include a visual indicator K1 to indicate a type of the light source apparatus 100.

The second mounting portion PA2 may include a second connector N2 connectable to the connector of the dimming driver 170. In an embodiment, in a case where the connector of the dimming driver 170 is a male connector, the second connector N2 may be a female connector. In a case where the connector of the dimming driver 170 is a female connector, the second connector N2 may be a male connector.

According to various embodiments, the second mounting portion PA2 may further include a visual indicator K2 to indicate a type of the light source apparatus 100.

The first visual indicator K1 and the second visual indicator K2 may be implemented in various forms such as letters, shapes, and icons, and may be different from each other to be distinguished from each other.

According to the disclosure, when the substrate 112 is manufactured for the first light source apparatus 100 or for the second light source apparatus 100, a manufacturer of the display apparatus 10 may intuitively recognize where to connect the connector of the dimming driver 170.

According to various embodiments, the connector of the dimming driver 170 may be connected to either the first connector N1 or the second connector N2.

The dimming driver 170 may transmit driving power and a dimming signal to the first light source apparatus 100 or the second light source apparatus 100 through the first connector N1 or the second connector N2.

The display apparatus 10 according to an embodiment may include the plurality of mounting portions PA1 and PA2, and the dimming driver 170 may be connected to only one of the plurality of mounting portions PA1 and PA2.

According to an embodiment, the display apparatus 10 may include the liquid crystal panel 20 and the light source apparatus 100.

According to an embodiment, the light source apparatus 100 may include the substrate 112 on which the plurality of LEDs 111 are arranged.

The plurality of LEDs 111 may include the plurality of first LEDs 111a connected in series to each other by the wiring Wa formed on the substrate 112; and the plurality of second LEDs 111b connected in series to each other by the wiring Wb formed on the substrate.

The substrate 112 may include a first connection portion SA formed between a first LED a2 of the plurality of first LEDs 111a and a second LED b1 of the plurality of second LEDs 111b.

Based on the first connection portion SA being electrically connected, the plurality of first LEDs 111a and the plurality of second LEDs 111b may operate as the same dimming block.

Based on the first connection portion SA being electrically blocked, the plurality of first LEDs 111a and the plurality of second LEDs 111b may operate as different dimming blocks. The substrate 112 may further include a jumper component J mounted on the first connection portion SA.

The first connection portion SA may be electrically connected or blocked depending on whether the jumper component J is mounted.

Based on the first connection portion SA being electrically connected, the first LED a2 and the second LED b1 are connected, and thus the plurality of first LEDs 111a and the plurality of second LEDs 111b may be connected in series.

Based on the first connection portion SA being electrically connected, the first LED a2 may be connected to a dummy wiring DB formed on the substrate 112 and extended to a predetermined position connectable to the driving device 300.

Based on the first connection portion SA being electrically connected, the second LED b1 may be connected to a dummy wiring DB formed on the substrate 112 and extended to a predetermined position connectable to the driving power source 60 that applies a driving voltage.

Based on the first connection portion SA being electrically connected, a third LED a1 of the plurality of first LEDs 111a may be connected to the driving power source 60 through the wiring Wa1 formed on the substrate 112.

Based on the first connection portion SA being electrically connected, a fourth LED b2 of the plurality of second LEDs 111b may be connected to the driving device 300 through the wiring Wb2 formed on the substrate 112.

Based on the first connection portion SA being electrically connected, the plurality of first LEDs 111a and the plurality of second LEDs 111b may operate with the same driving current.

Based on the first connection portion SA being electrically blocked, the first LED a2 may be connected to the first driving device 300a by the wiring Wa2 formed on the substrate 112.

Based on the first connection portion SA being electrically blocked, the second LED b1 may be connected to the first driving power source 60b by the wiring Wb1 formed on the substrate 112.

Based on the first connection portion SA being electrically blocked, a fifth LED a1 of the plurality of first LEDs 111a may be connected to the second driving power source 60a by the wiring Wa1 formed on the substrate 112, and a sixth LED b2 of the plurality of second LEDs 111b may be connected to the first driving device 300a by the wiring Wb2 formed on the substrate 112.

Based on the first connection portion SA being electrically blocked, the fifth LED a1 of the plurality of first LEDs 111a may be connected to the second driving power source 60a by the wiring Wa1 formed on the substrate 112, and the sixth LED b2 of the plurality of second LEDs 111b may be connected to the second driving device 300b by the wiring formed on the substrate 112.

Based on the first connection portion SA being electrically blocked, the plurality of first LEDs 111a and the plurality of second LEDs 111b may operate with different driving currents.

The number of first LEDs 111a and the number of second LEDs 111b may be the same.

The plurality of LEDs 111 may further include the plurality of third LEDs 111c connected in series to each other by the wiring Wc formed on the substrate 112, and the substrate 112 may further include a second connection portion SA2 formed between the second LED b1 of the plurality of second LEDs 111b and a seventh LED c2 of the plurality of third LEDs 111c.

The display apparatus 10 may further include the dimming driver 170 that controls the light source apparatus 100, the plurality of LEDs 111 may be provided on a first side of the substrate 112, and a second side of the substrate 112 may include a first mounting portion PA1 and a second mounting portion PA2 at different positions. Only one of the first mounting portion PA1 or the second mounting portion PA2 may be connected to a connector of the dimming driver 170.

According to an embodiment, a method for manufacturing the light source apparatus 100 may include forming a wiring w on the substrate 112; forming a connection portion SA on the substrate 112; and mounting a plurality of LEDs 111 on the substrate 112.

Based on the connection portion SA being electrically connected, the substrate 112 may include a plurality of first dimming blocks.

Based on the connection portion SA being electrically connected, the plurality of first LEDs 111a and the plurality of second LEDs 111b may operate as the same dimming block.

Based on the connection portion SA being electrically blocked, the plurality of first LEDs 111a and the plurality of second LEDs 111b may operate as different dimming blocks.

The method for manufacturing the light source apparatus 100 may further include mounting a jumper component J on the connection portion SA.

The method for manufacturing the light source apparatus 100 may further include mounting the driving device 300 on the wiring Wb2 connected to a third LED b2 of the plurality of second LEDs 111b.

The method for manufacturing the light source apparatus 100 may further include mounting the driving device 300 on the wiring Wa2 connected to the first LED a2.

The method for manufacturing the light source apparatus 100 may further include mounting the driving device 300 on the wiring Wb2 connected to the third LED b2 of the plurality of second LEDs 111b.

According to an aspect of the disclosure, display apparatuses with various resolutions may be manufactured using a single substrate.

According to an aspect of the disclosure, the number of substrate types for light source apparatuses may be reduced, thereby decreasing the number of production lines.

According to an aspect of the disclosure, ease of management of a substrate for a light source apparatus may be increased.

The effects that can be achieved by the disclosure are not limited to the above-mentioned effects, and other effects not mentioned will be clearly understood by one of ordinary skill in the technical art to which the disclosure belongs from the following description.

Although the disclosure has been shown and described in relation to specific embodiments, it would be appreciated by those skilled in the art that changes and modifications may be made in these embodiments without departing from the principles and scope of the disclosure, the scope of which is defined in the claims and their equivalents.

What is claimed is:

1. A display apparatus, comprising:
a liquid crystal panel; and
a light source apparatus comprising a substrate on which a plurality of light emitting diodes (LEDs) are arranged,
wherein the plurality of LEDs comprise:
a plurality of first LEDs configured to be connected in series to each other by a wiring formed on the substrate; and
a plurality of second LEDs configured to be connected in series to each other by a wiring formed on the substrate,
wherein the substrate comprises a first connection portion formed between a first LED of the plurality of first LEDs and a second LED of the plurality of second LEDs, and
wherein based on the first connection portion electrically connecting the first LED of the plurality of first LEDs and the second LED of the plurality of second LEDs, the plurality of first LEDs and the plurality of second LEDs are configured to operate as a same dimming block, and based on the first connection portion not electrically connecting the first LED of the plurality of first LEDs and the second LED of the plurality of second LEDs, the plurality of first LEDs and the plurality of second LEDs are configured to operate as different dimming blocks.

2. The display apparatus of claim 1, wherein the first connection portion is configured to electrically connect the first LED of the plurality of first LEDs and the second LED of the plurality of second LEDs based on whether a jumper component is mounted on the first connection portion.

3. The display apparatus of claim 1, wherein, based on the first connection portion electrically connecting the first LED of the plurality of first LEDs and the second LED of the plurality of second LEDs, the plurality of first LEDs and the plurality of second LEDs are configured to be connected in series.

4. The display apparatus of claim 1, wherein, based on the first connection portion electrically connecting the first LED of the plurality of first LEDs and the second LED of the plurality of second LEDs, the first LED is configured to be connected to a dummy wiring that is formed on the substrate and is extended to a predetermined position connectable to a driving device.

5. The display apparatus of claim 1, wherein, based on the first connection portion electrically connecting the first LED of the plurality of first LEDs and the second LED of the plurality of second LEDs, the second LED is configured to be connected to a dummy wiring that is formed on the substrate and is extended to a predetermined position connectable to a driving power source that applies a driving voltage.

6. The display apparatus of claim 1, wherein, based on the first connection portion electrically connecting the first LED of the plurality of first LEDs and the second LED of the plurality of second LEDs, a third LED of the plurality of first LEDs is configured to be connected to a driving power source through a wiring formed on the substrate, and a fourth LED of the plurality of second LEDs is configured to be connected to a driving device through a wiring formed on the substrate.

7. The display apparatus of claim 6, wherein the plurality of first LEDs and the plurality of second LEDs are configured to be operated with a same driving current.

8. The display apparatus of claim 1, wherein, based on the first connection portion not electrically connecting the first LED of the plurality of first LEDs and the second LED of the plurality of second LEDs, the first LED is configured to be connected to a first driving device by a wiring formed on the substrate, and the second LED is configured to be connected to a first driving power source by a wiring formed on the substrate.

9. The display apparatus of claim 1, wherein, based on the first connection portion not electrically connecting the first LED of the plurality of first LEDs and the second LED of the plurality of second LEDs, a fifth LED of the plurality of first LEDs is configured to be connected to a second driving power source by a wiring formed on the substrate, and a sixth LED of the plurality of second LEDs is configured to be connected to a first driving device by a wiring formed on the substrate.

10. The display apparatus of claim 1, wherein, based on the first connection portion electrically connecting the first LED of the plurality of first LEDs and the second LED of the plurality of second LEDs, a fifth LED of the plurality of first LEDs is configured to be connected to a second driving power source by a wiring formed on the substrate, and a sixth LED of the plurality of second LEDs is configured to be connected to a second driving device by a wiring formed on the substrate.

11. The display apparatus of claim 1, wherein, based on the first connection portion not electrically connecting the first LED of the plurality of first LEDs and the second LED of the plurality of second LEDs, the plurality of first LEDs and the plurality of second LEDs are configured to be operated with different driving currents.

12. The display apparatus of claim 1, wherein a number of first LEDs and a number of second LEDs are equal to each other.

13. The display apparatus of claim 1, wherein the plurality of LEDs further comprise a plurality of third LEDs configured to be connected in series by a wiring formed on the substrate, wherein the substrate further comprises a second connection portion formed between the second LED of the plurality of second LEDs and a seventh LED of the plurality of third LEDs.

14. The display apparatus of claim 1, further comprising:

a dimming driver configured to control the light source apparatus, wherein the plurality of LEDs are provided on a first side of the substrate, a second side of the substrate comprises a first mounting portion and a second mounting portion disposed in different positions, and only one of the first mounting portion or the second mounting portion is configured to be connected to a connector of the dimming driver.

15. A method for manufacturing a light source apparatus, the method comprising:

forming a wiring on a substrate;

forming a connection portion on the substrate; and mounting a plurality of light emitting diodes (LEDs) on the substrate, wherein the connection portion is formed between a first LED of a plurality of first LEDs connected in series to each other by a wiring formed on the substrate, and a second LED of a plurality of second LEDs connected in series to each other by a wiring formed on the substrate, and wherein based on the connection portion electrically connecting the first LED of the plurality of first LEDs and the second LED of the plurality of second LEDs, the plurality of first LEDs and the plurality of second LEDs operate as a same dimming block, and based on the connection portion not electrically connecting the first LED of the plurality of first LEDs and the second LED of the plurality of second LEDs, the plurality of first LEDs and the plurality of second LEDs operate as different dimming blocks.

16. The method of claim 15, wherein the connection portion electrically connects the first LED of the plurality of first LEDs and the second LED of the plurality of second LEDs based on whether a jumper component is mounted on the connection portion.

17. The method of claim 15, wherein, based on the connection portion electrically connecting the first LED of the plurality of first LEDs and the second LED of the plurality of second LEDs, the plurality of first LEDs and the plurality of second LEDs are connected in series.

18. The method of claim 15, wherein, based on the connection portion electrically connecting the first LED of the plurality of first LEDs and the second LED of the plurality of second LEDs, the first LED is connected to a dummy wiring that is formed on the substrate and is extended to a predetermined position connectable to a driving device.

19. The method of claim 15, wherein, based on the connection portion electrically connecting the first LED of the plurality of first LEDs and the second LED of the plurality of second LEDs, the second LED is connected to a dummy wiring that is formed on the substrate and is extended to a predetermined position connectable to a driving power source that applies a driving voltage.

20. The method of claim 15, wherein, based on the connection portion electrically connecting the first LED of the plurality of first LEDs and the second LED of the plurality of second LEDs, a third LED of the plurality of first LEDs is connected to a driving power source through a wiring formed on the substrate, and a fourth LED of the plurality of second LEDs is connected to a driving device through a wiring formed on the substrate.

* * * * *